(12) United States Patent
Wu et al.

(10) Patent No.: US 12,476,146 B2
(45) Date of Patent: Nov. 18, 2025

(54) SELF-ALIGNED SCHEME FOR SEMICONDUCTOR DEVICE AND METHOD OF FORMING THE SAME

(71) Applicant: Taiwan Semiconductor Manufacturing Co., Ltd., Hsinchu (TW)

(72) Inventors: Cai-Ling Wu, Hsinchu (TW); Hsiu-Wen Hsueh, Taichung (TW); Wei-Ren Wang, New Taipei (TW); Po-Hsiang Huang, Taipei (TW); Chii-Ping Chen, Hsinchu (TW); Jen Hung Wang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 133 days.

(21) Appl. No.: 18/365,490

(22) Filed: Aug. 4, 2023

(65) Prior Publication Data
US 2023/0377966 A1    Nov. 23, 2023

Related U.S. Application Data

(62) Division of application No. 17/371,416, filed on Jul. 9, 2021, now Pat. No. 11,901,228.
(Continued)

(51) Int. Cl.
*H01L 21/768*     (2006.01)
*H01L 23/532*     (2006.01)
*H01L 23/535*     (2006.01)

(52) U.S. Cl.
CPC .. *H01L 21/76897* (2013.01); *H01L 21/76805* (2013.01); *H01L 21/76829* (2013.01); *H01L 21/76843* (2013.01); *H01L 21/76895* (2013.01); *H01L 23/53295* (2013.01); *H01L 23/535* (2013.01)

(58) Field of Classification Search
CPC ......... H01L 21/76897; H01L 21/76805; H01L 21/76829; H01L 21/76843; H01L 21/76895; H01L 21/76807; H01L 21/76849; H01L 21/76883; H01L 21/76834; H01L 21/76832; H01L 23/53295; H01L 23/535; H01L 23/5226;
(Continued)

(56) References Cited

U.S. PATENT DOCUMENTS 7,368,377 B2   5/2008   Whelan et al.
8,242,028 B1   8/2012   van Schravendijk et al.
(Continued)

*Primary Examiner* — Britt D Hanley
(74) *Attorney, Agent, or Firm* — Slater Matsil, LLP

(57) ABSTRACT

In an embodiment, a method includes forming a first conductive feature in a first inter-metal dielectric (IMD) layer; depositing a blocking film over and physically contacting the first conductive feature; depositing a first dielectric layer over and physically contacting the first IMD layer; depositing a second dielectric layer over and physically contacting the first dielectric layer; removing the blocking film; depositing an etch stop layer over any physically contacting the first conductive feature and the second dielectric layer; forming a second IMD layer over the etch stop layer; etching an opening in the second IMD layer and the etch stop layer to expose the first conductive feature; and forming a second conductive feature in the opening.

20 Claims, 23 Drawing Sheets

Related U.S. Application Data

(60) Provisional application No. 63/168,389, filed on Mar. 31, 2021.

(58) Field of Classification Search
CPC ............. H10D 84/0158; H10D 84/038; H10D 84/0149
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,059,257 B2 | 6/2015 | Li et al. |
| 9,105,490 B2 | 8/2015 | Wang et al. |
| 9,236,267 B2 | 1/2016 | De et al. |
| 9,236,300 B2 | 1/2016 | Liaw |
| 9,460,997 B2 | 10/2016 | Kuo et al. |
| 9,520,482 B1 | 12/2016 | Chang et al. |
| 9,576,814 B2 | 2/2017 | Wu et al. |
| 9,659,864 B2 | 5/2017 | Wu et al. |
| 10,937,689 B2 | 3/2021 | Chandhok et al. |
| 10,957,579 B2 | 3/2021 | Kim et al. |
| 10,998,263 B2 | 5/2021 | Liang et al. |
| 2004/0018748 A1 | 1/2004 | Lu et al. |
| 2005/0020058 A1 | 1/2005 | Gracias et al. |
| 2015/0287680 A1 | 10/2015 | Jin et al. |
| 2017/0186682 A1* | 6/2017 | Anderson ......... H01L 21/31053 |
| 2019/0021176 A1* | 1/2019 | Law ..................... H05K 3/4038 |
| 2020/0006116 A1 | 1/2020 | Lee et al. |
| 2021/0098290 A1 | 4/2021 | Hsueh et al. |

\* cited by examiner

SELF-ALIGNED SCHEME FOR SEMICONDUCTOR DEVICE AND METHOD OF FORMING THE SAME

PRIORITY CLAIM AND CROSS-REFERENCE

This application is a divisional of U.S. patent application Ser. No. 17/371,416, filed on Jul. 9, 2021, entitled "Self-Aligned Scheme for Semiconductor Device and Method of Forming the Same," which claims the benefit of U.S. Provisional Application No. 63/168,389, filed on Mar. 31, 2021, which applications are hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
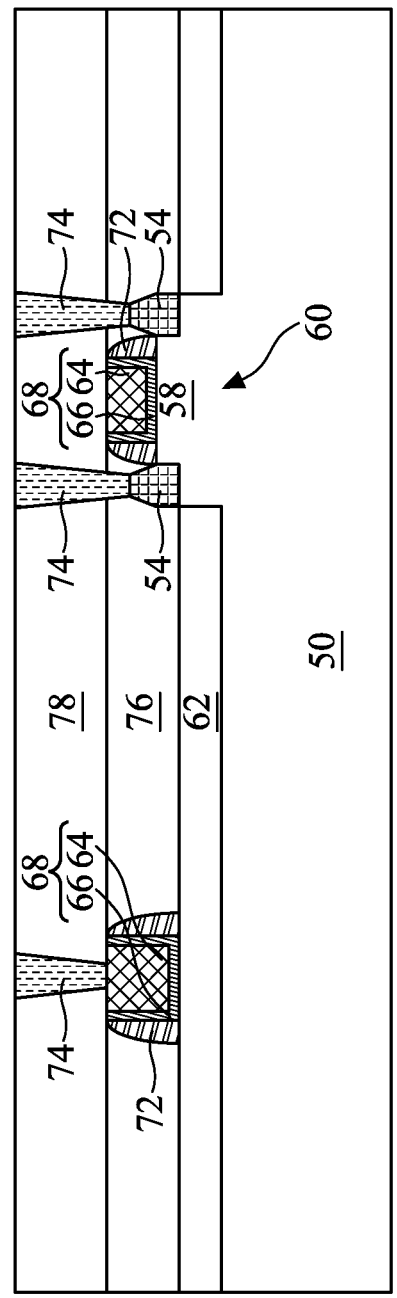
FIGS. 1, 2, 3, 4, 5, 6, 7, 8, 9, 10A, 10B, 10C, 11A, 11B, 11C, 12A, 12B, and 12C illustrate cross-sectional views of intermediate stages in the formation of interconnect structures of integrated circuits, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a semiconductor device (e.g., an integrated circuit device) may be formed to have first conductive features in a first metallization layer and second conductive features in an overlying second metallization layer. When some of the second conductive features are misaligned over the first conductive features, embodiments described herein are able to prevent or reduce parasitic capacitance, breakdown pathways, and/or leakage current that may otherwise be caused by the misalignment. For example, the conductive features, including conductive lines and conductive vias, may form portions of an interconnect structure. The first conductive features are forming in a first insulating layer, and a blocking film is selectively deposited over the first conductive features. A first dielectric layer (e.g., a low-k dielectric material) and a second dielectric layer (e.g., a high-k dielectric material) are selectively deposited (or self-aligned) over the first insulating layer and prevented by the blocking film from depositing over the first conductive features. The blocking film may then be removed, and an etch stop layer is formed over the first conductive features and the second dielectric layer. Before forming the second conductive features, a second insulating layer is formed and openings are etched through the second insulating layer to expose the first conductive features. If any of the openings are misaligned, the second dielectric layer protects the underlying first insulating layer from being etched. The second conductive features that are subsequently formed in the misaligned openings will physically contact the underlying first conductive features while also having an overbite portion that hangs over the second dielectric layer. Because the overbite portion of those second conductive features may be closer to other nearby conductive features, presence of the first dielectric layer ensures that parasitic capacitance is prevented or reduced due to the first dielectric layer being a low-k dielectric material. For example, parasitic capacitance is prevented or reduced between any nearby conductive features—which may be ones of the second conductive features (e.g., conductive lines and/or conductive vias) and/or ones of the first conductive features—whether formed with correct alignment or misaligned. As a result of the disclosed embodiments, the semiconductor device may be manufactured with increased yield and function with greater reliability.

FIGS. 1 through 17 illustrate cross-sectional views of intermediate stages in the formation of interconnect structures comprising conductive features of an integrated circuit device, in accordance with some embodiments. FIGS. 1 through 8 may illustrate formation of first conductive features in a first metallization layer of an interconnect structure using a single damascene process. FIGS. 9 through 12C may illustrate formation of second conductive features in a second metallization layer (e.g., including conductive lines and/or conductive vias) of an interconnect structure using a single or dual damascene process. FIGS. 13 through 17 may illustrate other embodiments in the formation of first and second conductive features of an interconnect structure using a single or dual damascene process.

FIG. 1 illustrates a cross-sectional view of a semiconductor structure on a wafer too comprising a substrate 50 (e.g., a semiconductor substrate) in which various electronic devices may be formed over the substrate 50, in accordance with some embodiments. In subsequent figures, a multilevel interconnect system (e.g., a front-side interconnect structure) may be formed over the various electronic devices and the substrate 50. Generally, as will be discussed in greater detail below, FIG. 1 illustrates a Fin field effect transistor (FinFET) device 60 formed on a substrate 50, with multiple metallization layers formed thereover in later figures. Planar transistors, gate-all-around (GAA) transistors, and other types of devices are within the contemplated scope of this disclosure, however.

Generally, the substrate 50 illustrated in FIG. 1 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multilayered substrates, gradient substrates, or hybrid orientation substrates.

The FinFET device 60 illustrated in FIG. 1 is a three-dimensional metal-on-semiconductor field effect transistor (MOSFET) structure formed in fin-like strips of semiconductor protrusions referred to as fins 58. The cross-section shown in FIG. 1 is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 1 illustrates a single fin 58, although the substrate 50 may comprise any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of the fins 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1 may be a high-k, metal gate (HKMG) gate structure that may be formed using a gate-last process flow. In a gate last process flow, a sacrificial dummy gate structure (not shown) is formed over the fin 58 after forming the STI regions 62. The dummy gate structure may comprise a dummy gate dielectric, a dummy gate electrode, and a hard mask. First, a dummy gate dielectric material (e.g., silicon oxide, silicon nitride, silicon oxynitride, or the like) may be deposited. Next, a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may then be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins 58 and extend between the fins 58 over the surface of the STI regions 62. As described in greater detail below, the dummy gate structure may be replaced by the gate structure 68 as illustrated in FIG. 1. The gate structure 68 illustrated in the right side in FIG. 1 (seen on the top of fin 58) is an example of an active gate structure which extends, e.g., along sidewalls of and over the portion of fin 58 protruding above the STI region 62. The gate structure 68 in the left side in FIG. 1 is an example gate structure extending over the STI region 62, such as between adjacent fins 58. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 6o, illustrated in FIG. 1, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin 58 (as illustrated in the right side of FIG. 1) or the surface of the STI region 62 (as illustrated in the left side of FIG. 1).

The source and drain regions 54 are semiconductor regions in contact with the fin 58. In some embodiments, the source and drain regions 54 may comprise heavily-doped regions and relatively lightly-doped drain (LDD) extensions.

Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily-doped regions of the source and drain regions 54 may be formed self-aligned to the spacers 72. In particular, the heavily-doped drain regions may be formed by first etching the fins to form recesses, and then depositing a crystalline semiconductor material in the recess by a selective epitaxial growth (SEG) process that may fill the recess and, typically, extend beyond and above the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, $Si_{1-x-y}Ge_xC_y$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped regions of the source and drain regions 54 either in situ during SEG, by an ion implantation process performed after the SEG, or by a combination thereof. The source and drain regions 54 may be formed by other processes, such as ion implantation of dopants, and the like.

Still referring to FIG. 1, a first interlayer dielectric (ILD) layer 76 is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer 76.

The gate structures 68, illustrated in FIG. 1, may then be formed by first removing the dummy gate structures using one or more etching techniques, thereby creating recesses between respective spacers 72. Next, a replacement gate dielectric layer 66 comprising one or more dielectrics, followed by a replacement conductive gate layer 64 comprising one or more conductive materials, may be deposited to completely fill the recesses. The gate dielectric layer 66 includes, for example, a high dielectric constant (high-k) material such as oxides and/or silicates of metals (e.g., oxides and/or silicates of Hf, Al, Zr, La, Mg, Ba, Ti, and other metals), silicon nitride, silicon oxide, and the like, combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, TiSiN, TaSiN, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, physical vapor deposition (PVD), ALD, PEALD, electrochemical plating (ECP), electroless plating and/or the like. Excess portions of the gate structure layers 64 and 66 may be removed from over the top surface of first ILD layer 76 using, for example, a CMP process. The resulting structure, as illustrated in FIG. 1, may have a substantially coplanar surface comprising an exposed top surface of the first ILD layer 76, the spacers 72, and remaining portions of the gate layers (e.g., the gate structure layers 64 and 66) inlaid between respective spacers 72.

A second ILD layer 78 may be deposited over the first ILD layer 76, as illustrated in FIG. 1. In some embodiments, the insulating materials to form the first ILD layer 76 and the second ILD layer 78 may comprise silicon oxide, phosphosilicate glass (PSG), borosilicate glass (BSG), boron-doped phosphosilicate glass (BPSG), undoped silicate glass (USG), a low dielectric constant (low-k) material such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 76 and the second ILD layer 78 may be deposited using any suitable method, such as CVD, PVD, ALD, PEALD, PECVD, SACVD, FCVD, spin-on, and/or the like, or a combination thereof. In some embodiments, one or more etch stop layers (not specifically illustrated) are also formed over the structure above and/or below the illustrated ILD layers.

As illustrated in FIG. 1, electrodes of electronic devices formed in the substrate 50 may be electrically connected to subsequently formed conductive features of a first metallization level using conductive connectors (e.g., contact plugs 74) formed through the intervening dielectric layers. In the example illustrated in FIG. 1, the contact plugs 74 make electrical connections to the source and drain regions 54 of the FinFET 60. The contact plugs 74 to gate electrodes are typically formed over STI regions 62. A separate gate electrode 64 (shown in the left in FIG. 1) illustrates such contacts. The contact plugs 74 may be formed using photolithography techniques. For example, a patterned mask may be formed over the second ILD layer 78 and used to etch openings that extend through the second ILD layer 78 to expose a portion of the gate electrodes 64 over the STI regions 62, as well as to etch openings over the fins 58 that extend further, through the first ILD layer 76 and the CESL (not shown) liner below first ILD layer 76 to expose portions of the source and drain regions 54. In some embodiments, an anisotropic dry etch process may be used wherein the etching is performed in two successive steps. The etchants used in the first step of the etch process have a higher etch rate for the materials of the first and second ILD layers 76 and 78 relative to the etch rate for the materials used in the conductive gate layer 64 and the CESL, which may be lining the top surface of the heavily-doped regions of the source and drain regions 54. Once the first step of the etch process exposes the CESL, the second step of the etch process may be performed wherein the etchants may be switched to selectively remove the CESL. While the two ILD layers (e.g., the first ILD layer 76 and the second ILD layer 78) are illustrated, embodiments having only a single ILD layer, or having three or more ILD layers, are within the contemplated scope of this disclosure.

In some embodiments, a conductive liner may be formed in the openings in the first ILD layer 76 and the second ILD layer 78. Subsequently, the openings are filled with a conductive fill material. The liner comprises barrier metals used to reduce out-diffusion of conductive materials from the contact plugs 74 into the surrounding dielectric materials. In some embodiments, the liner may comprise two barrier metal layers. The first barrier metal comes in contact with the semiconductor material in the source and drain regions 54 and may be subsequently chemically reacted with the heavily-doped region in the source and drain regions 54 to form a low resistance ohmic contact, after which the unreacted metal may be removed. For example, if the heavily-doped region in the source and drain regions 54 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). The conductive fill material (e.g., W, Al, Cu, Ru, Ni, Co, alloys of these, the like, or any combination thereof) may be deposited over the conductive liner layer to fill the contact openings, using any acceptable deposition technique (e.g., CVD, ALD, PEALD, PECVD, PVD, ECP, electroless plating, the like, or any combination thereof). Next, a planarization process (e.g., CMP) may be used to remove excess portions of all the conductive materials from over the surface of the second ILD layer 78. The resulting conductive plugs extend into the first and second ILD layers 76 and 78 and constitute the contact plugs 74 making physical and electrical connections to the electrodes of electronic devices, such as the FinFET device 60 (e.g., a tri-gate FinFET), as illustrated in FIG. 1. In this example, contacts to electrodes over the STI region 62 and to electrodes over the fins 58 are formed simultaneously using the same processing steps. However, in other embodiments these two types of contacts may be formed separately.

In FIGS. 2 through 18C, a front-side interconnect structure 80 is formed over the second ILD layer 78. The front-side interconnect structure 80 may be electrically connected to the contact plugs 74. In FIGS. 2-12, first conductive features 120 of the front-side interconnect structure 80 are formed in an inter-metal dielectric (IMD) layer 110. In FIGS. 13-18C, second conductive features 220 of the front-side interconnect structure 80 are formed in an IMD layer 210 over and electrically connected to the first conductive features 120.

Figure 2:
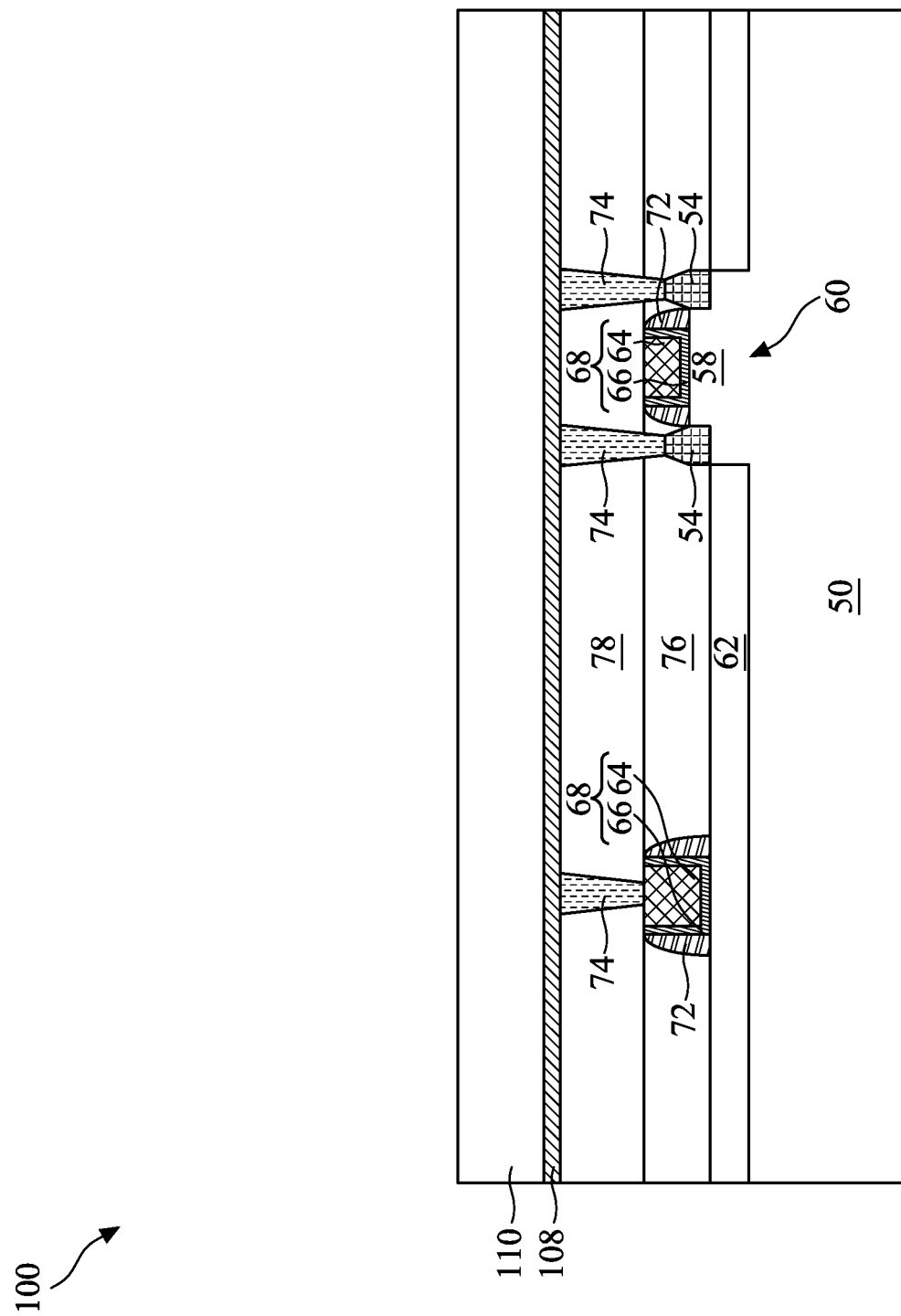

In FIG. 2, an etch stop layer 108 is formed over the FinFETs 60 and other electronic devices, the second ILD layer 78, and the contact plugs 74, and the IMD layer 110 is formed over the etch stop layer 108. The etch stop layer 108 may be formed from silicon carbide, silicon nitride, silicon oxynitride, silicon carbonitride, aluminum nitride, aluminum oxide, the like, or combinations thereof. The etch stop layer 108 may be formed by CVD, PVD, ALD, a spin-on-dielectric process, the like, or a combination thereof. The IMD layer 110 may be a layer formed from a low-k dielectric material, for example, having a k-value lower than about 3.9. The IMD layer 110 may be a layer formed from an extra-low-k (ELK) dielectric material having a k-value of less than 2.5. In some embodiments, the IMD layer 110 may be formed from an oxygen-containing and/or carbon containing low-k dielectric material, such as silicon oxide, Hydrogen SilsesQuioxane (HSQ), MethylSilsesQuioxane (MSQ), or the like. The material of the etch stop layer 108 has a high etch selectivity with the IMD layer 110 (e.g., different etch selectivities such that the faster of these etch rates may be more than 5 times faster than the slower of these etch rates), and hence the etch stop layer 108 may be used to stop the etching of the IMD layer 110 in subsequent processing steps.

In some embodiments, the IMD layer 110 is formed from a porous material such as SiOCN, SiCN, SiOC, SiOCH, or the like and may be formed by initially forming a precursor layer over the etch stop layer 108. The precursor layer may include both a matrix material and a porogen interspersed within the matrix material, or may alternatively include the matrix material without the porogen. In some embodiments the precursor layer may be formed, for example, by co-depositing the matrix and the porogen using a process such as PECVD where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the etch stop layer 108, may also be utilized.

Figure 3:
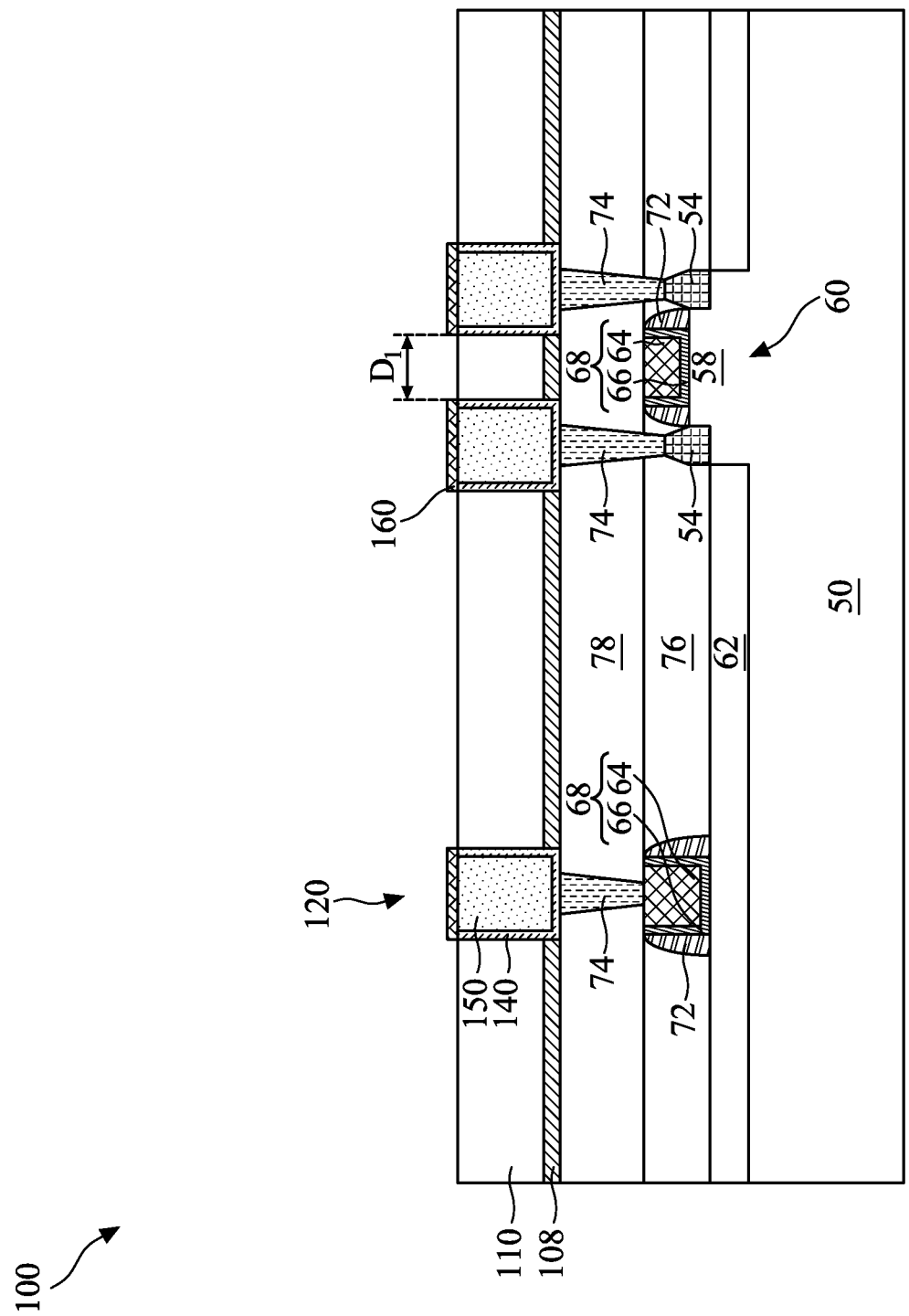

In FIG. 3, the first conductive features 120 are formed in the IMD layer 110. Openings are formed in the IMD layer 110 using a photolithography process. For example, a buffer layer and a mask layer may be formed over the IMD layer 110, patterned using a photoresist, and etched to form initial openings. The openings may then be extended through the IMD layer 110 using acceptable etching techniques, such as an isotropic or an anisotropic process. For example, an anisotropic dry etch process may include a reaction gas that selectively etches the IMD layer 110 without significantly etching the mask layer. The etching process is performed until the openings expose the etch stop layer 108, and then portions of the etch stop layer 108 in the openings are removed, such as using an anisotropic wet or dry etch process, to expose the underlying target contact plugs 74.

The first conductive features 120 may be formed in the openings by depositing a liner layer 140 along walls of the openings, a conductive fill material 150 in the openings, and a capping layer 160 over the conductive fill material 150. Although not specifically illustrated, the liner layer 140 may comprise a plurality of layers, including a barrier and one or more liners. For example, the barrier of the liner layer 140 is formed on the exposed surface of wafer too and in the openings by PVD, ALD, the like, or a combination thereof. The barrier may comprise a metal, such as titanium, tantalum, tantalum nitride, the like, or a combination thereof. In addition, each of the liners is formed on the barrier and in the openings by CVD, PVD, ALD, the like, or a combination thereof. Each of the liners may comprise cobalt, ruthenium, molybdenum, rhodium, the like, or a combination thereof. In accordance with some embodiments, after forming the liners, a liner treatment, such as a hydrogen soak treatment and/or a hydrogen plasma treatment, may be performed to convert the liners into a combined liner.

After forming the liner layer 140, the conductive fill material 150 is deposited to fill a remainder of the openings. Excess conductive material may also be formed along a top surface of the liner layer 140 and over the IMD layer 110. The conductive fill material 150 may be a metallic material including a metal or a metal alloy such as copper, silver, gold, tungsten, cobalt, aluminum, manganese, or alloys thereof. In some embodiments, the formation of the conductive fill material 150 includes depositing a thin seed layer (not shown), which may include copper or a copper alloy, and filling the rest of the openings using CVD, PVD, ALD, ECP, such as high voltage ECP, or electroless plating.

A planarization process may be performed to remove excess of the conductive fill material 150 and the liner layer 140. In addition, the planarization process may remove remaining portions of the mask layer and the buffer layer, thereby exposing a top surface of the IMD layer 110. The planarization process may be a grinding or a CMP, and may be performed such that the top surfaces of the conductive fill material iso, the liner layer 140, and the IMD layer 110 are level (within process variations).

After the planarization process, the capping layer 160 is deposited over the IMD layer 110, the liner layer 140, and the conductive fill material 150 using CVD, PECVD, PVD, ALD, PEALD, ECP, electroless plating, and/or the like. The capping layer 160 may comprise cobalt, ruthenium, the like, or a combination thereof. The capping layer 160 provides protection from oxidation of underlying portions of the first conductive features 120, such as the conductive fill material iso. After depositing the material for the capping layer 160, excess portions may be removed with any suitable method, such as using lithography. For example, a photoresist may be formed over the material of the capping layer 160 and patterned to expose portions of the material of the capping layer 160 that are not directly over the liner layer 140 and the conductive fill material 150. The exposed portions may then be removed by etching or any suitable method, and the photoresist may then be removed by any suitable method. In some embodiments, the capping layer 160 is selectively deposited over the conductive fill material 150 or over both the conductive fill material 150 and the liner layer 140. In some embodiments, small amounts of the capping layer 160 may also deposit over the IMD layer 110. The capping layer 160 may be deposited using any of the techniques identified with respect to the layers of the liner layer 140 or the conductive fill material iso. The capping layer 160 may then be patterned to remove portions such as the small amounts deposited over the IMD layer 110. The capping layer 160 may have a thickness of between about 5 Å and about 40 Å.

It should be noted that although each of the first conductive features 120 is illustrated as being located in the same cross-section, some of the first conductive features 120 may be located in different cross-sections. However, in some embodiments, neighboring or adjacent ones of the first conductive features 120 may be in the same cross-section and have a distance $D_1$ from one another.

Figure 4:
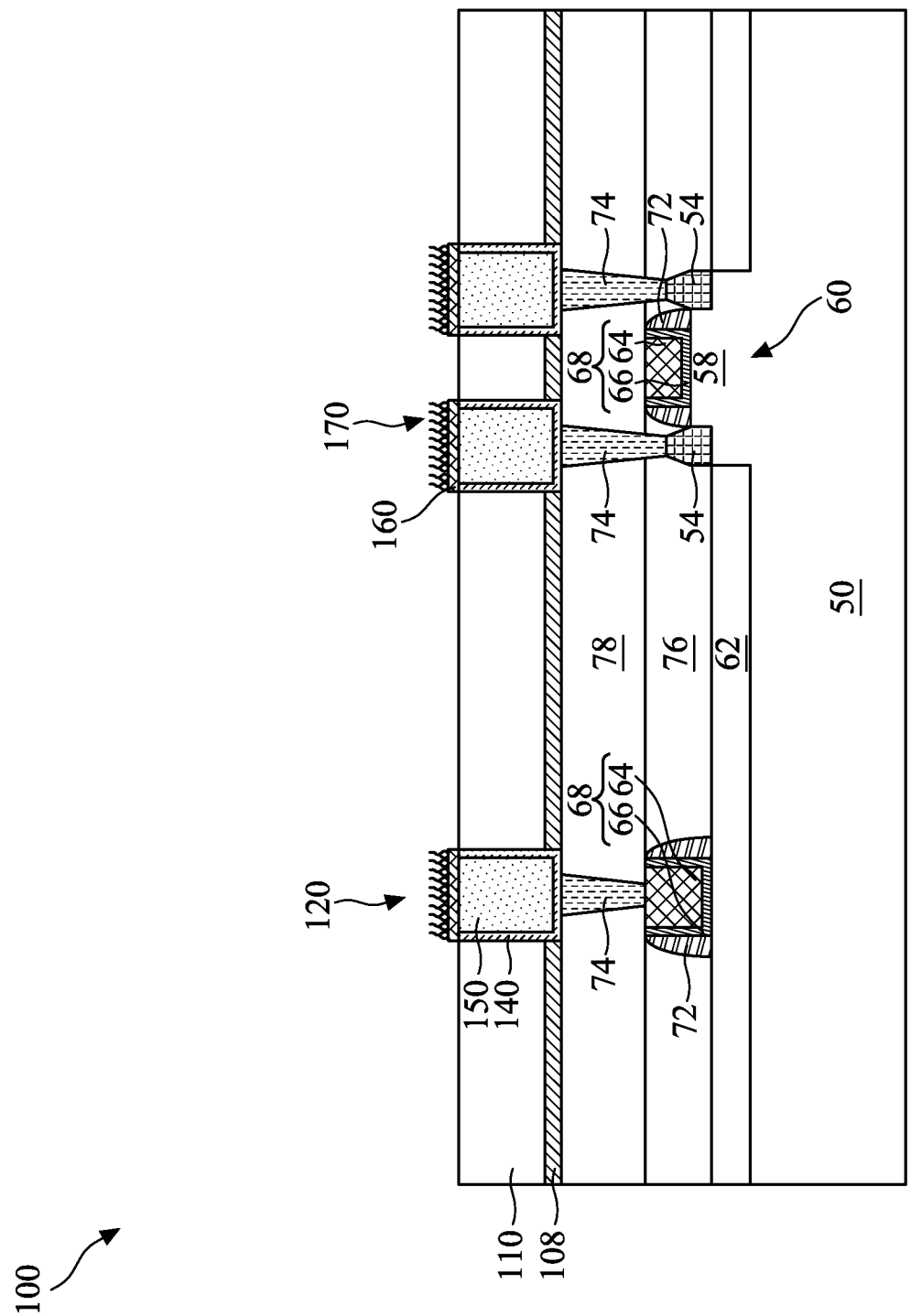

In FIG. 4, a blocking film formed over and aligned with the first conductive features 120 (e.g., the capping layer 160). In accordance with some embodiments, the blocking film 170 is selectively deposited over the capping layer 160, while the exposed surface of the IMD layer 110 remains substantially free of the blocking film 170. The blocking film 170 may comprise a self-assembling monolayer (SAM) material including hydrophilic head and hydrophobic tail groups. For example, the hydrophilic head groups of the blocking film 170 may comprise phosphate groups and/or high-nitrogen (hi-N) groups and may be inorganic. In addition, the hydrophobic tail groups of the blocking film 170 may be organic and comprise one or more carbon chains.

When deposited, the blocking film 170 may comprise an organic layer, a self-cross-link layer, a self-adhesion layer, other suitable layer, or combinations thereof. In some embodiments, the blocking film 170 is coated on the capping layer 160 by a chemical adsorption process, such that the blocking film 170 adsorbs only to the metal surface of the capping layer 160, while the IMD layer 110 remains substantially free of the blocking film 170 due to having a different polarity. In particular, the hydrophilic head groups adsorb to the surface of the capping layer 160 while the hydrophobic tail groups will tend to orient to form an exposed top surface of the blocking film 170 (e.g., distal or opposite from the capping layer 160). A thickness of the blocking film 170 may be modulated, such as being increased between subsequently formed higher level conductive features of the front-side interconnect structure 80. For example, the thickness of the blocking film 170 may be between about to A and about too A.

Figure 5:
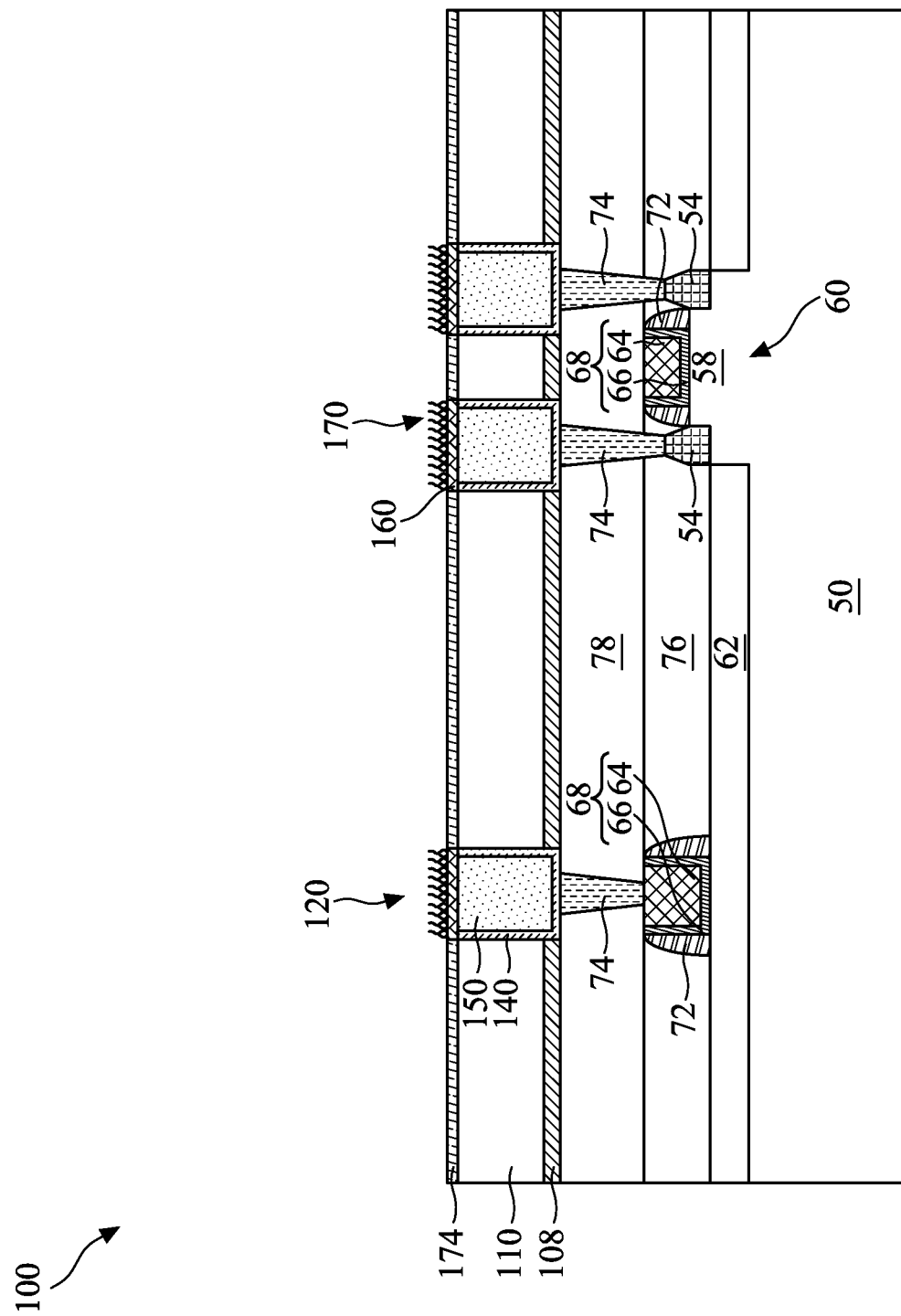

In FIG. 5, a first dielectric layer 174 of a multilayer dielectric is formed over and aligned with the IMD layer 110, and may further be formed adjacent to sidewalls of the capping layer 160 and the blocking film 170. In accordance with some embodiments, the first dielectric layer 174 is formed through selective deposition using ALD, CVD, or the like, over the IMD layer 110, while the exposed top surface of the blocking film 170 remains substantially free of the first dielectric layer 174. For example, the first dielectric layer 174 may comprise a low-k material, such as silicon oxide ($SiO_x$), silicon oxycarbide ($SiO_xC_y$), silicon carbonitride ($SiC_yN_z$), silicon oxycarbonitride ($SiO_xC_yN_z$), boronitride, aluminum boronitride, the like, or combinations thereof. In some embodiments, the first dielectric layer 174 may have a dielectric constant of between about 2.6 and about 5.

The first dielectric layer 174, having a compatible polarity with the IMD layer 110, will self-align over the IMD layer 110 while tending to avoid the blocking film 170 (e.g., the hydrophobic tail groups) along the exposed top surface of the blocking film 170. Being formed of a low-k material, the first dielectric layer 174 reduces or prevents parasitic capacitance between subsequently formed conductive features (e.g., second conductive features 220 discussed below) and nearby first conductive features 120. In particular, parasitic capacitance is reduced or prevented between all conductive features (e.g., the first conductive features 120 and the second conductive features 220/220M) whether one or both have been aligned correctly or misaligned. The reduction of parasitic capacitance may be particularly advantageous when those subsequently formed conductive features are misaligned over the corresponding first conductive features 120, thereby resulting in separation distances less than the distance $D_1$, as discussed in greater detail below. Similarly as with the blocking film 170, a thickness of the first dielectric layer 174 may be modulated, such as being increased between subsequently formed higher level conductive features of the front-side interconnect structure 80. For example, the thickness of the first dielectric layer 174 may be between about 10 Å and about 50 Å.

Figure 6:
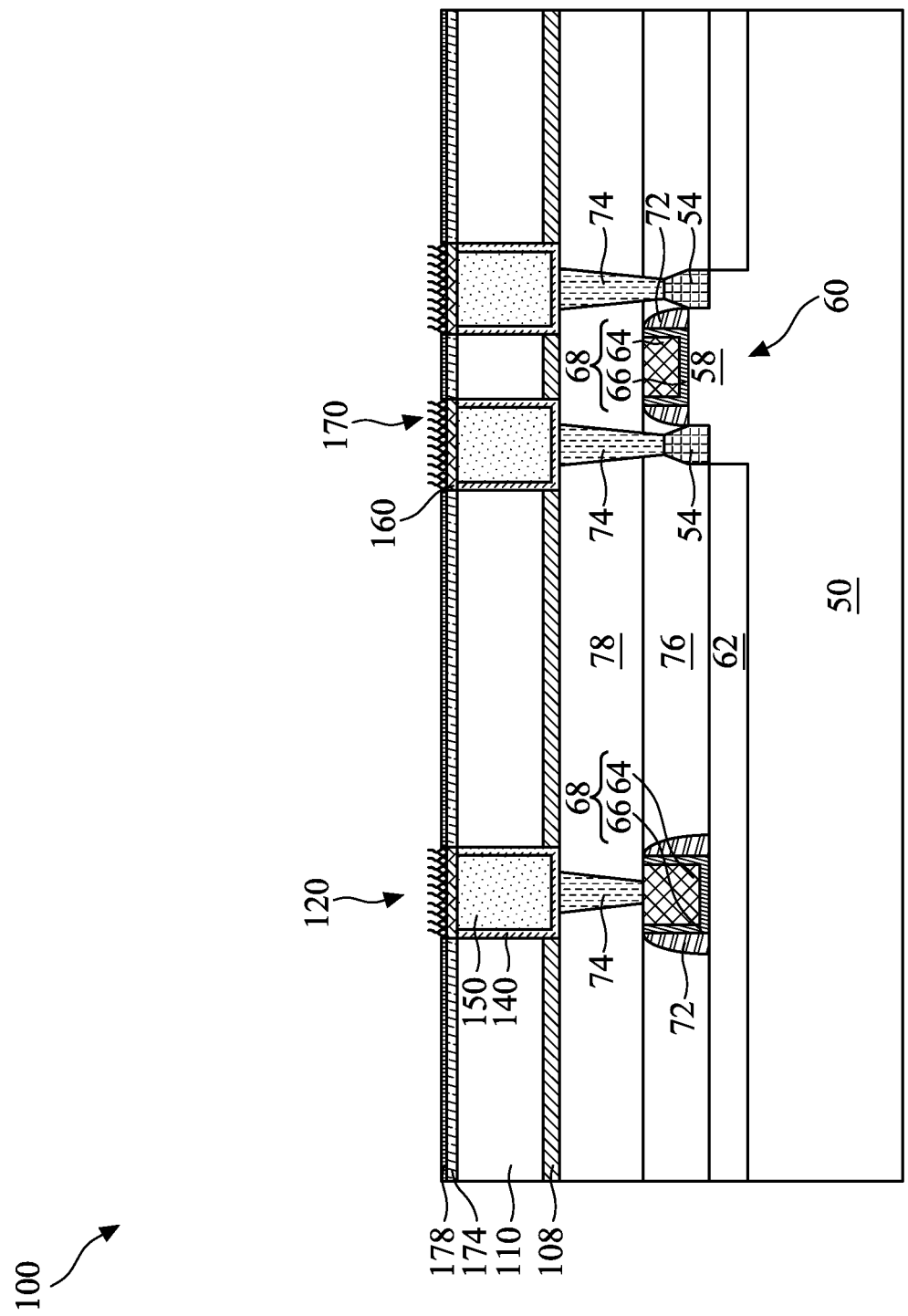

In FIG. 6, a second dielectric layer 178 of the multilayer dielectric is formed over and aligned with the first dielectric layer 174, and may further be adjacent to sidewalls of the blocking film 170. In accordance with some embodiments, the second dielectric layer 178 is formed through selective deposition using ALD, CVD, or the like, over the first dielectric layer 174, while the exposed top surface of the blocking film 170 remains substantially free of the second dielectric layer 178. For example, the second dielectric layer 178 may comprise a high-k material, such as a metal oxide or metal nitride, including aluminum oxide ($Al_2O_3$), aluminum nitride ($Al_2N_3$), aluminum oxynitride (AlON), yttrium oxide ($Y_2O_3$), silicon carbide, silicon carbonitride, silicon oxycarbonitride, the like, or combinations thereof. In some embodiments, the second dielectric layer 178 may have a dielectric constant of greater than 5, such as between about 7 and 14.

The second dielectric layer 178, having a compatible polarity with the first dielectric layer 174, will self-align over the first dielectric layer 174 while tending to avoid the blocking film 170 (e.g., the hydrophobic tail groups) along the exposed top surface of the blocking film 170. The material of the second dielectric layer 178 is chosen as having a high etch selectivity with a subsequently formed etch stop layer 208. Having the high etch selectivity allows the second dielectric layer 178 to remain intact when openings are later formed in the etch stop layer 208. The high etch selectivity may be particularly advantageous when those openings are misaligned over the IMD layer 110, as discussed in greater detail below. Similarly as with the blocking film 170 and the first dielectric layer 174, a thickness of the second dielectric layer 178 may be modulated, such as being increased between subsequently formed higher level conductive features of the front-side interconnect structure 80 or, in other embodiments, the first dielectric layer 174 may be increased for the higher level conductive features while the second dielectric layer 178 remains the same due to its higher dielectric constant. For example, the thickness of the second dielectric layer 178 may be between about 10 Å and about 40 Å.

Figure 7:
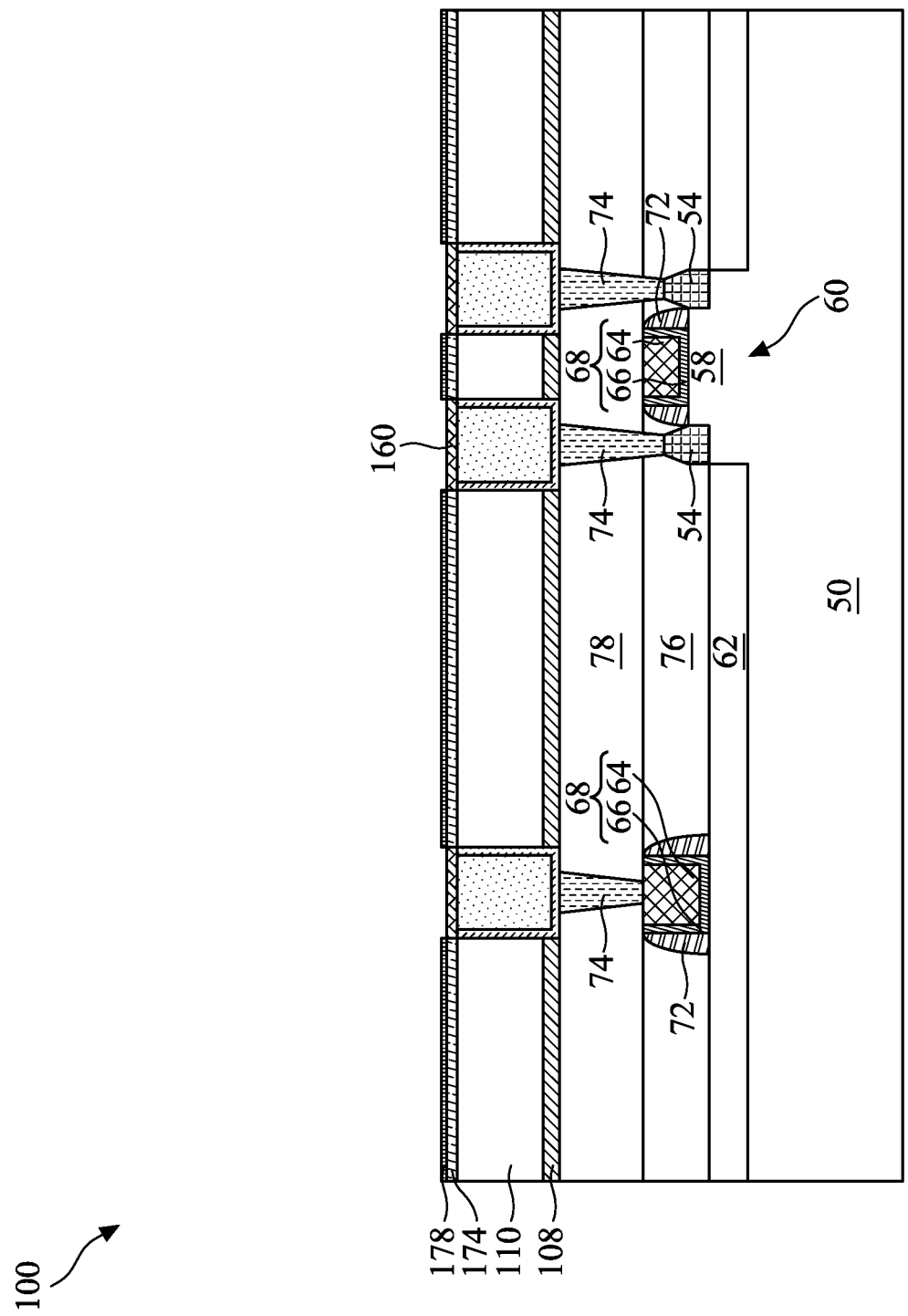

In FIG. 7, the blocking film 170 is removed, thereby exposing the capping layer 160. In some embodiments, the blocking film 170 is removed by a hydrogen treatment. For example, a reacting gas comprising $H_2$ may be flowed over the structure at pressures of between about 1 Torr and about 3 Torr and at temperatures of between about 250° C. and about 400° C. The hydrophilic head groups (e.g., the inorganic material) of the blocking film 170 react with the $H_2$ gas, and the blocking film 170 is removed from the surface of the capping layer 160. In other embodiments, the blocking film 170 is removed by a nitrogen treatment. For example, a reacting gas comprising $N_2$, $NH_3$, or a combination thereof is flowed over the structure treatment at pressures of between about 1 Torr and about 3 Torr and at temperatures of about 250° C. to about 400° C. The hydrophilic tail groups (e.g. the inorganic material) of the blocking film 170 react with the nitrogen-containing gas, and the blocking film 170 is removed from the surface of the capping layer 160. As illustrated, after removing the blocking film 170, a top surface of the second dielectric layer 178 may be higher than the top surface of the capping layer 160. In some embodiments, a top surface of the first dielectric layer 174 may also be higher than the top surface of the capping layer 160.

Figure 8:
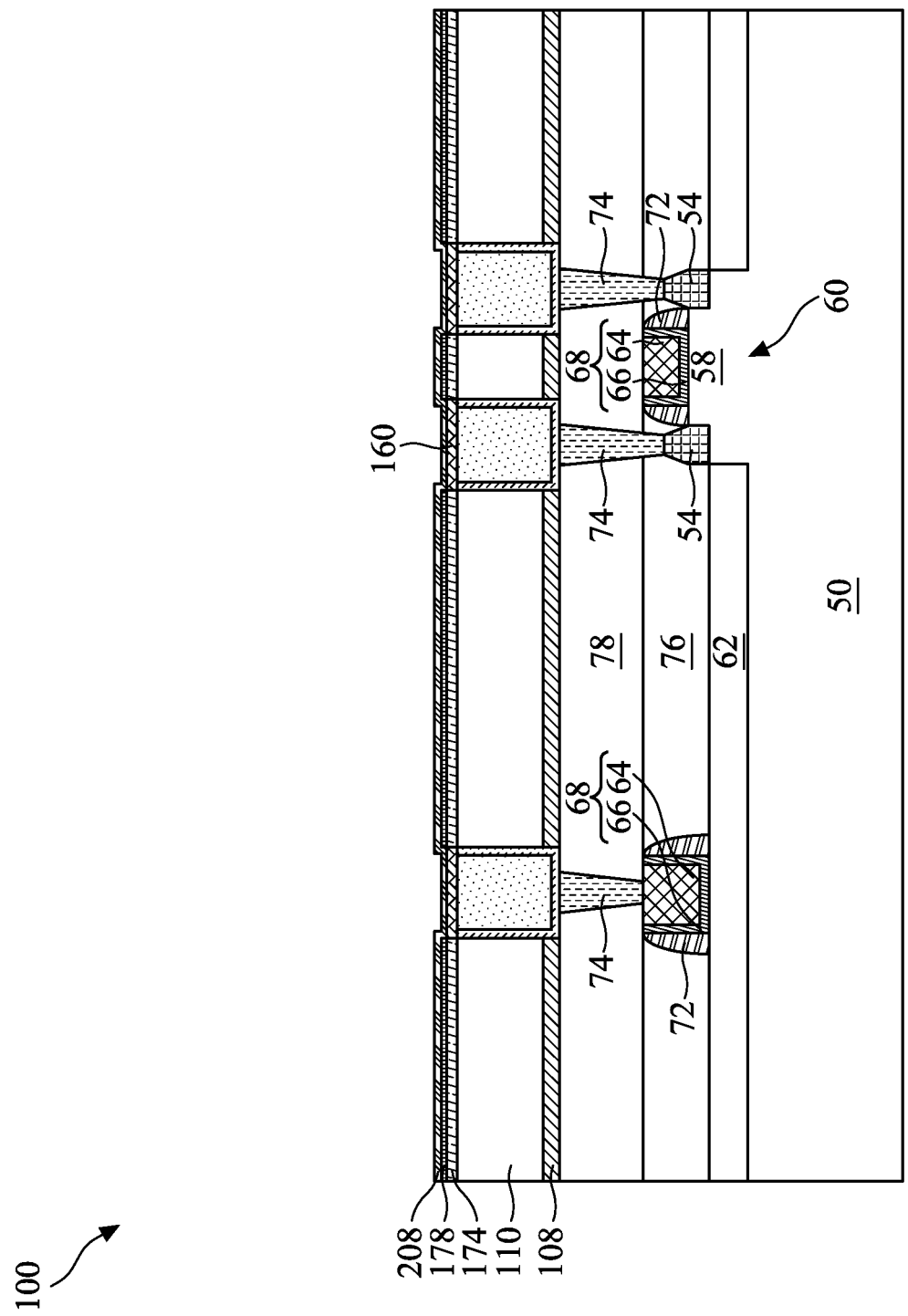

In FIG. 8, an etch stop layer 208 is formed over the first conductive features 120 and the second dielectric layer 178. The etch stop layer 208 may be conformally deposited and formed of similar materials (e.g., silicon carbide, silicon nitride, silicon oxynitride, silicon carbonitride, aluminum oxide ($AlO_x$), aluminum nitride, or the like) and by a similar process (e.g., using ALD, CVD, or the like) as described above in connection with the etch stop layer 108. As discussed above, the etch stop layer 208 may have a high etch selectivity with the second dielectric layer 178 (e.g., an etch rate of the etch stop layer 208 may be up to about 10 times faster than an etch rate of the second dielectric layer 178). In some embodiments, the etch stop layer 208 may have a low etch selectivity with the first dielectric layer 174 (e.g., having similar etch rates). The low etch selectivity may be due to the etch stop layer 208 and the first dielectric layer 174 comprising similar materials. The etch stop layer 208 may be formed to a thickness of between about 5 Å and about 150 Å.

Figure 9:
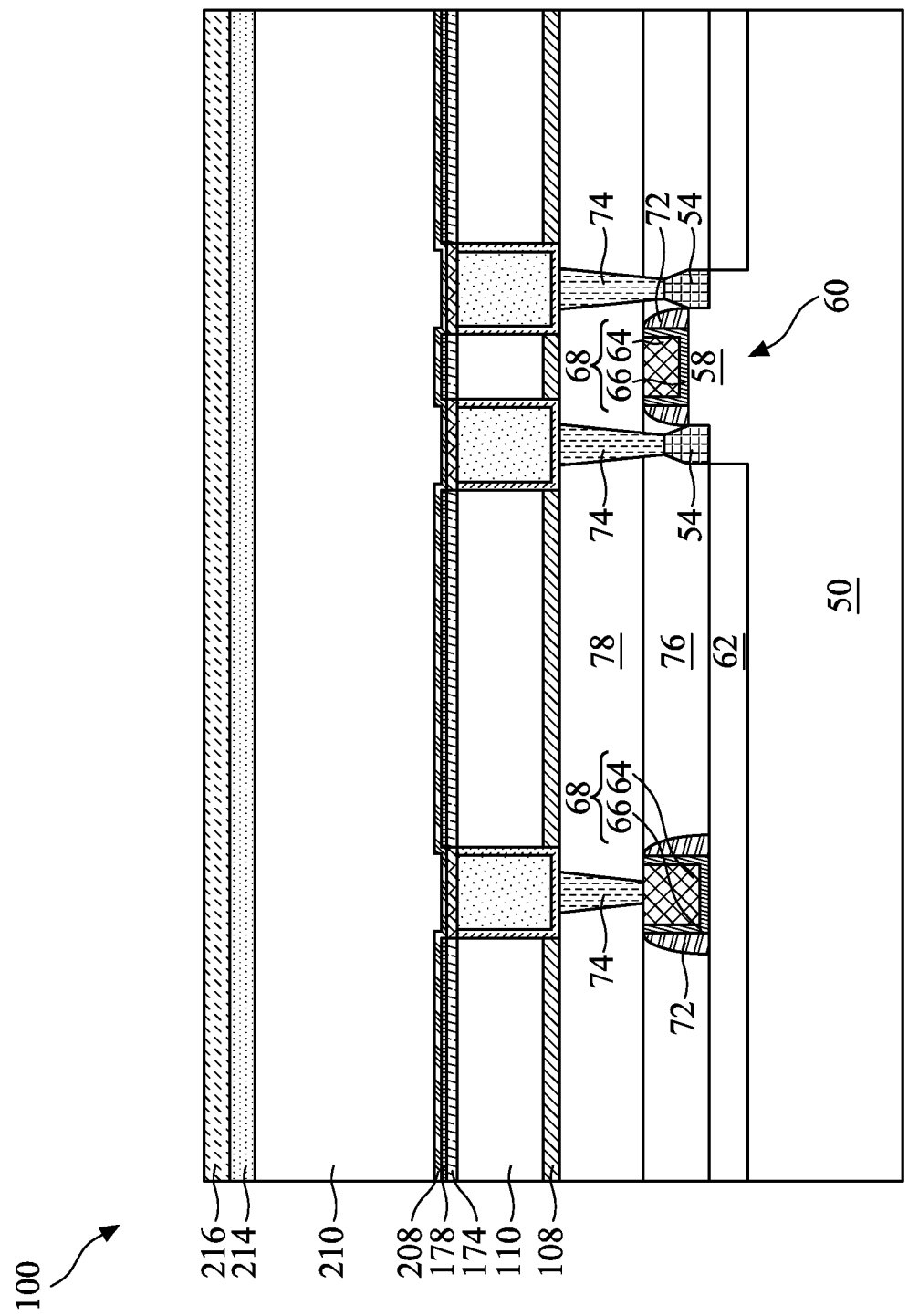

In FIG. 9, an IMD layer 210 and a film stack (e.g., a buffer layer 214, and a mask layer 216) are formed over the etch stop layer 208. The IMD layer 210 may be formed of similar materials and by a similar process as described above in connection with the IMD layer 110. In addition, the buffer layer 214 and the mask layer 216 may be formed of similar materials and by similar processes as described above in connection with the buffer layer and the mask layer, respectively, formed over the IMD layer 110. The material of the etch stop layer 208 has a high etch selectivity with the IMD layer 210, and hence the etch stop layer 208 may be used to stop the etching of the IMD layer 210 in subsequent processing steps.

In some embodiments, the film stack includes more than one buffer layer 214 and mask layer 216, which may be formed in alternating fashion. The buffer layer 214 may be formed from a dielectric, such as silicon oxide, and may be formed by CVD, PVD, ALD, a spin-on-dielectric process, or the like. The mask layer 216 may be formed from a material that includes a metal, such as titanium nitride, titanium, tantalum nitride, tantalum, or the like, and may be formed by PVD, Radio Frequency PVD (RFPVD), ALD, or the like. The buffer layer 214 and the mask layer 216 may be formed of similar materials and by similar processes as used with the buffer layer and the mask layer formed over the IMD layer 110 as discussed above.

Figure 10A:
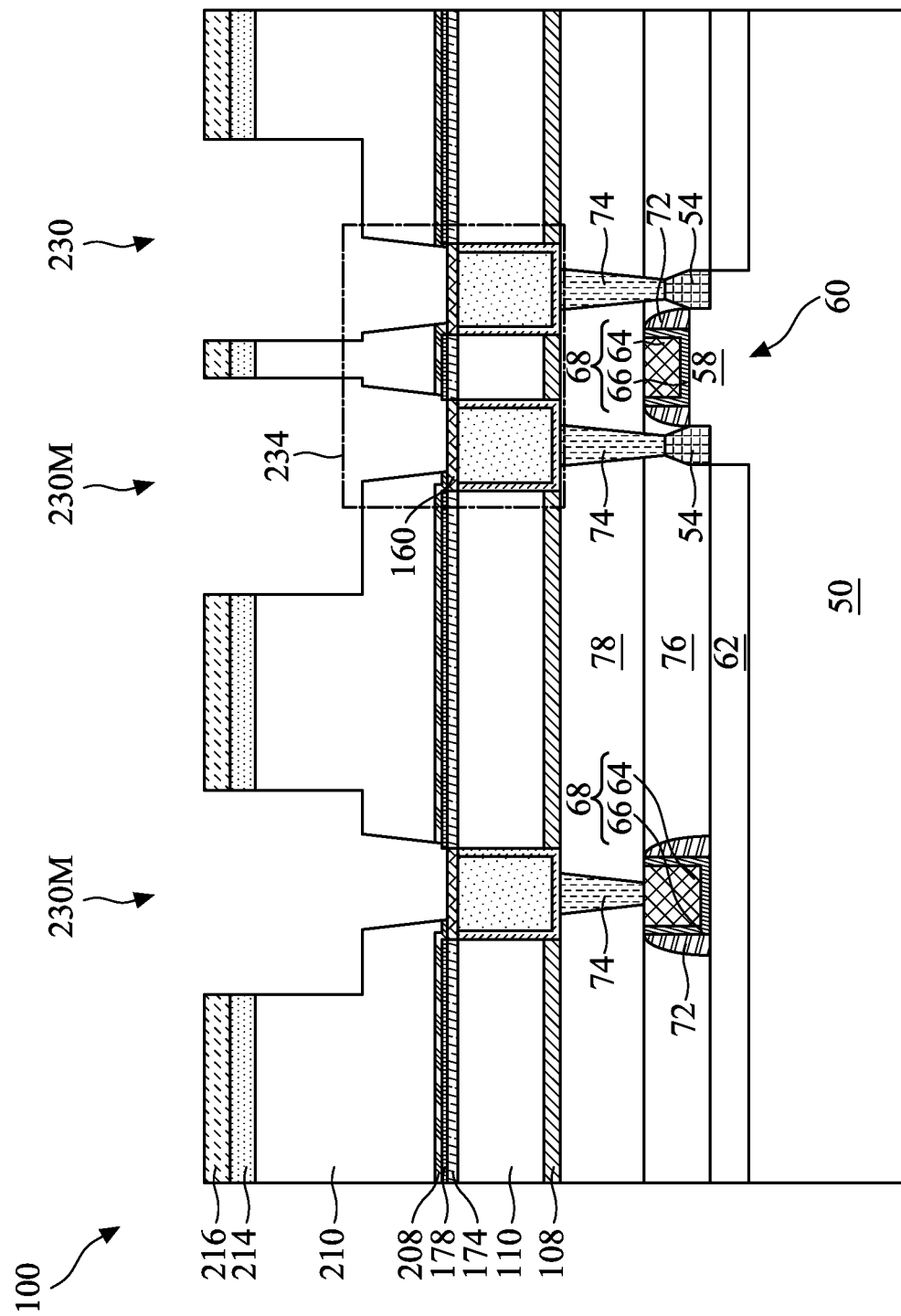
Figure 10B:
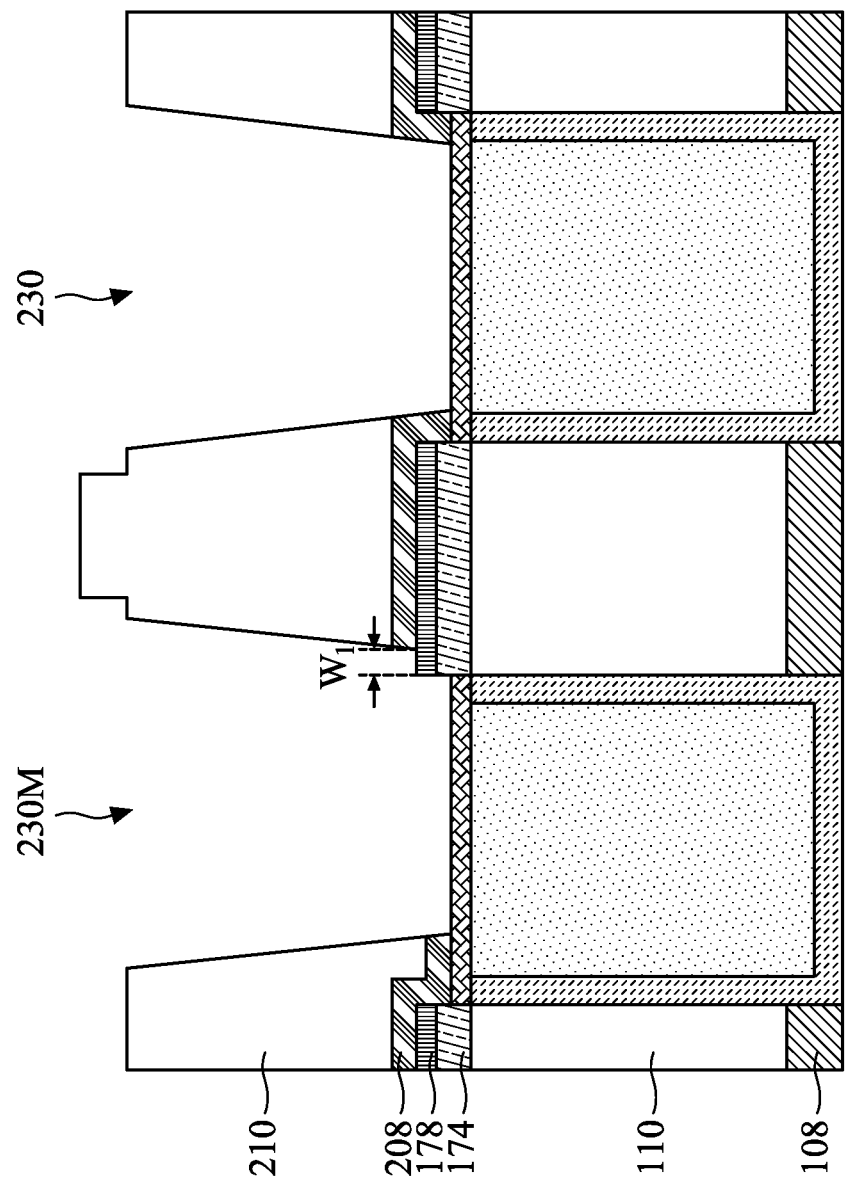
Figure 10C:
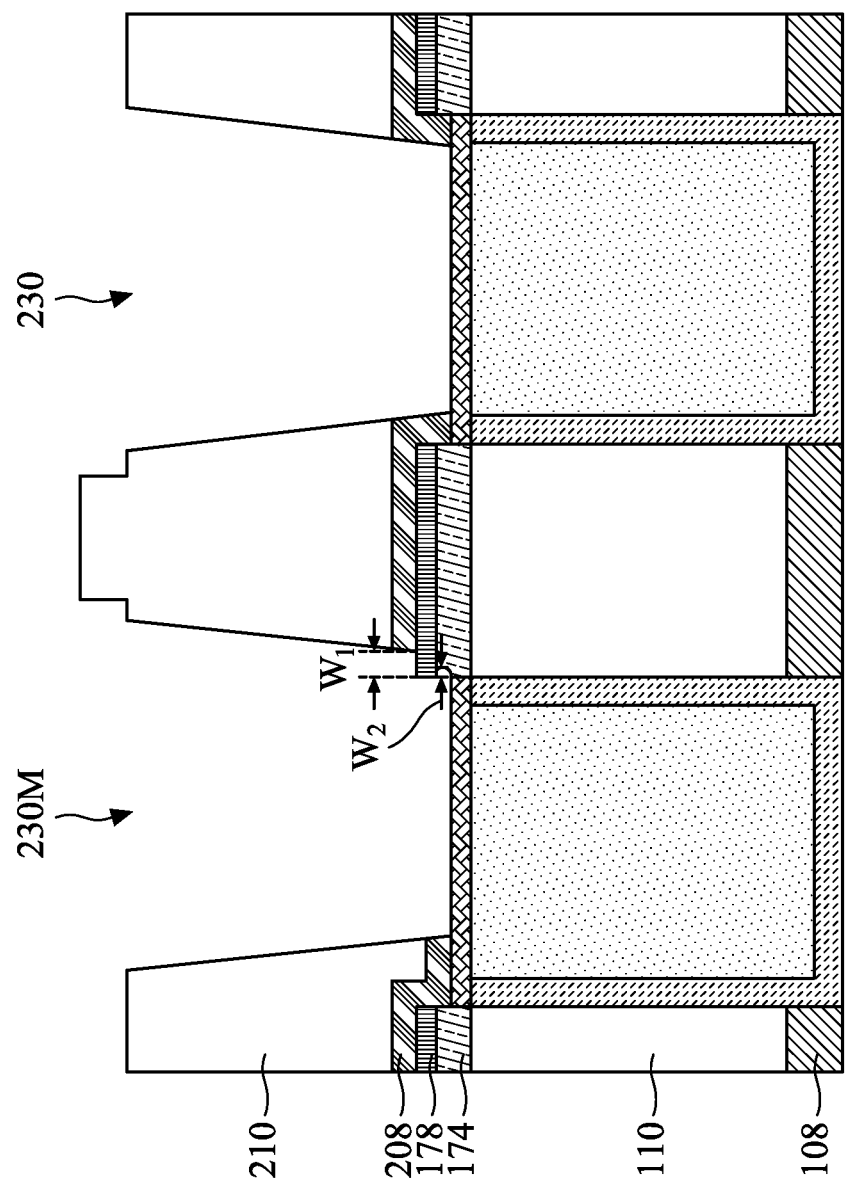

In FIG. 10A through 10C, openings or trenches 230 are formed in the mask layer 216, and the openings 230 are extended through the buffer layer 214, the IMD layer 210, and the etch stop layer 208. For example, a pattern is formed on the mask layer 216. The mask layer 216 is then used as an etching mask, where the pattern of the mask layer 216 is used to etch the buffer layer 214 and the IMD layer 110. The buffer layer 214 provides stress reduction between the IMD layer 110 and the mask layer 216.

The openings 230 may be formed and extended by the acceptable etching techniques and etchants described above in connection with openings 130, such as using an isotropic etch, an anisotropic etch, or a combination thereof. The openings 230 expose the underlying first conductive features 120 (e.g., the capping layer 160). The etch stop layer 108 may then be removed using an isotropic wet etch or an anisotropic wet or dry etch that is selective to the material of the etch stop layer 108. For example, using an anisotropic wet etch, the etchant reactants may comprise $H_2O_2$, HF, ammonium fluoride ($NH_4F$), ozone deionized water (DI-$O_3$), the like, or combinations thereof. The etching process used to remove the etch stop layer 108 may be similar or different from the etching processes used to form the openings 130 (e.g., different etchants, etching techniques, and/or process parameters may be used).

The openings 230 may be patterned using a dual damascene process, as illustrated, or using a single damascene process. For example, in a dual damascene process, upper portions of the openings 230 will house metallization lines of the second conductive features 220, and lower portions of the openings 230 will house conductive vias of the second conductive features 220 to electrically connect the second conductive features 220 with the underlying first conductive features 120. Note that although each of the openings 230 is illustrated as being located in the same cross-section, some of the openings 230 may be located in different cross-sections.

As further illustrated, in accordance with some embodiments, some of the openings 230 may be misaligned openings 230M, which overhang (or are misaligned with) an underlying first conductive feature 120. As a result, a bulk of a lower portions of the misaligned openings 230M may be directly over the first conductive features 120, while a minority may be directly over the second dielectric layer 178, the first dielectric layer 174, and the IMD layer 110. When the misaligned opening 230M extends through the etch stop layer 208 and reaches a top surface of the second dielectric layer 178, the second dielectric layer 178 remains substantially unetched due to having a high etch selectivity with the etch stop layer 208, which the etchants are selected to etch. As a result, the second dielectric layer 178 protects the IMD layer 110 from being etched under the misaligned openings 230M. In addition, the second dielectric layer 178 may also substantially protect the first dielectric layer 174 (which may have a low etch selectivity with the etch stop layer 208) from being etched, thereby allowing the first dielectric layer 174 to assist in protecting the IMD layer 110.

In FIGS. 10B and 10C, zoomed-in views of region 234 (see FIG. 10A) illustrate varying shapes of the lower portions of one of the aligned openings 230 and one of the misaligned openings 230M. The selection of etchants, etching methods (e.g., isotropic or anisotropic), and materials of the first dielectric layer 174, the second dielectric layer 178, and the etch stop layer 208 may affect the shapes of the openings 230. In addition, presence of the first dielectric layer 174 and the second dielectric layer 178 reduce distances between one of the first conductive features 120 and the misaligned opening 230M (including a subsequently formed misaligned second conductive feature 220M, as discussed below). Reducing these distances helps to prevent or reduce parasitic capacitance that may otherwise occur between the first conductive feature 120 and the misaligned second conductive feature 220M. Further, presence of the first dielectric layer 174 (e.g., a low-k dielectric layer) prevents or reduces any parasitic capacitance that may otherwise occur.

Referring to FIG. 10B, in some embodiments, the openings 230 may be formed using an anisotropic dry etch process, and the lower portion of the misaligned opening 230M may expose a first width $W_1$ of the top surface of the second dielectric layer 178. As illustrated, the high etch selectivity between the second dielectric layer 178 and the etch stop layer 208 results in the etchant substantially stopping at the second dielectric layer 178. In addition, the second dielectric layer 178 protects the first dielectric layer 174 from being etched. For example, the first width $W_1$ may be between about 0 Å and about 50 Å.

Referring to FIG. 10C, in other embodiments, the openings 230 may be formed using an isotropic or an anisotropic wet etch process, and the lower portion of the misaligned opening 230M may expose the first width $W_1$ of the top surface of the second dielectric layer 178 as discussed above. However, while the second dielectric layer 178 protects a top surface of the first dielectric layer 174 as discussed above, an exposed side surface of the first dielectric layer 174 may be etched. As a result of using an isotropic or anisotropic wet etch process, some of the wet etchants that reach the exposed side surface of the first dielectric layer 174 may be able to etch laterally due to the low etch selectivity discussed above. For example, the first dielectric layer 174 may be etched below the second dielectric layer 178 by a second width $W_2$. As illustrated, the second dielectric layer 178 provides protection to the first dielectric layer 174, and the first dielectric layer 174 provides protection to the underlying IMD layer 110. Due to presence of the second dielectric layer 178, the etchant may etch only a small portion of the first dielectric layer 174 below the second dielectric layer 178. For example, the second width $W_2$ may be between about 0 Å and about 50 Å.

Figure 11A:
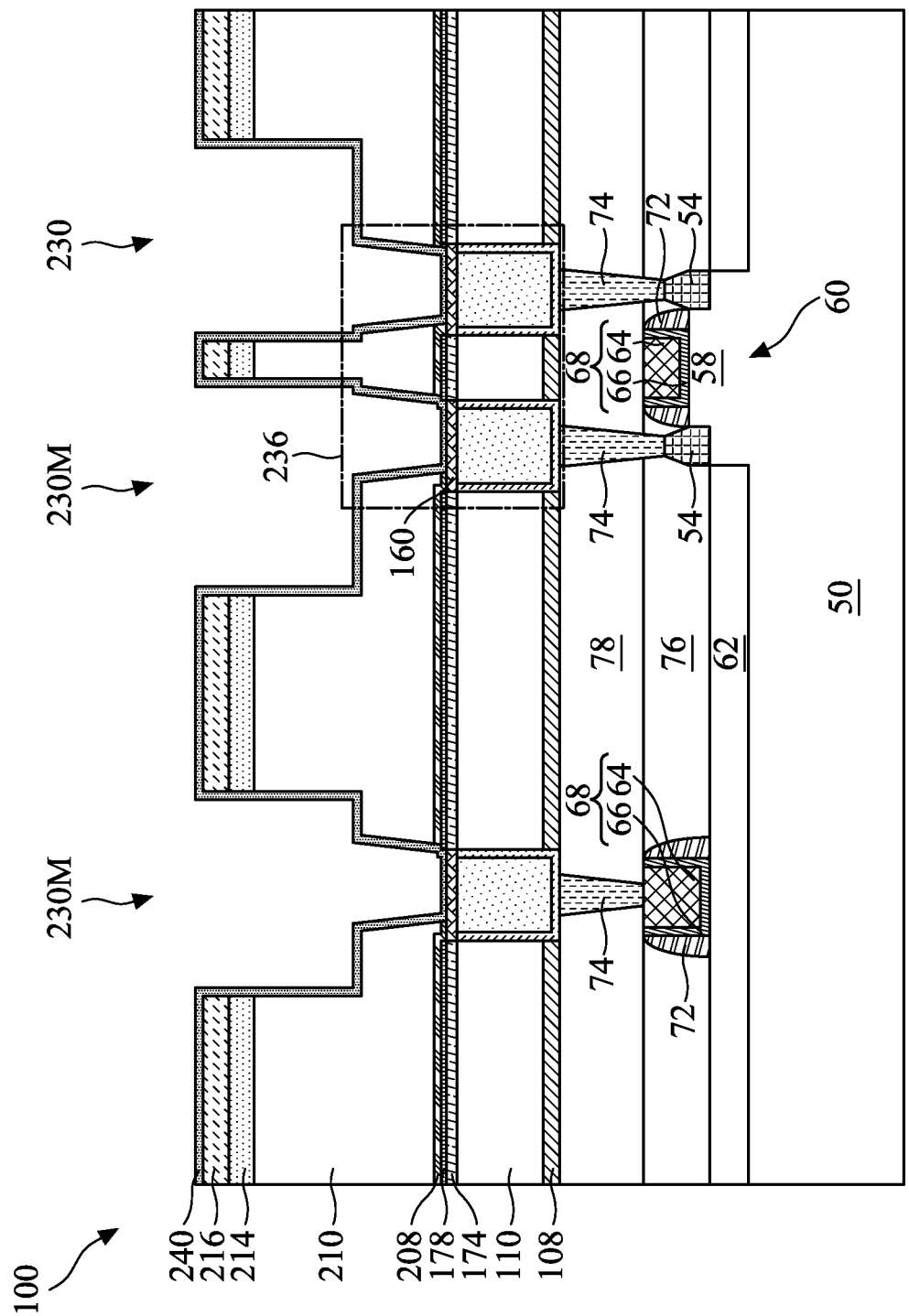
Figure 11B:
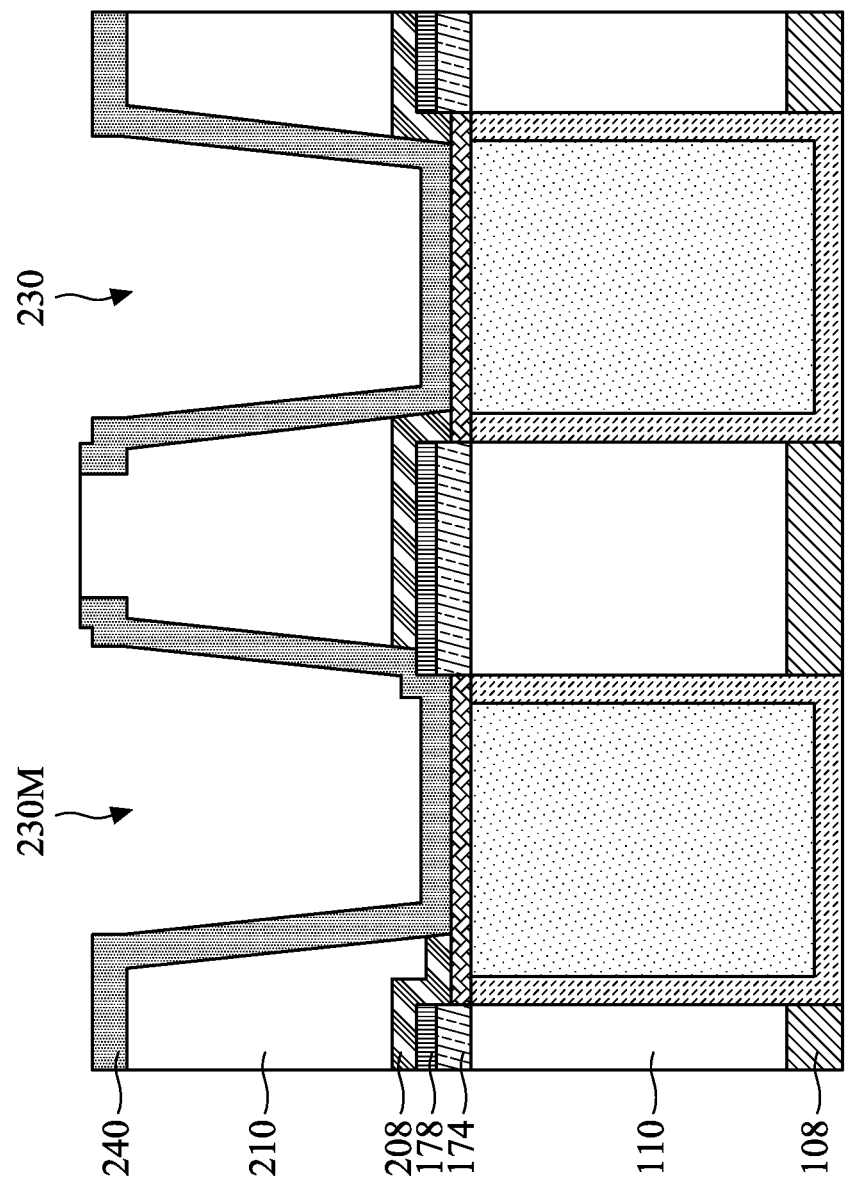
Figure 11C:
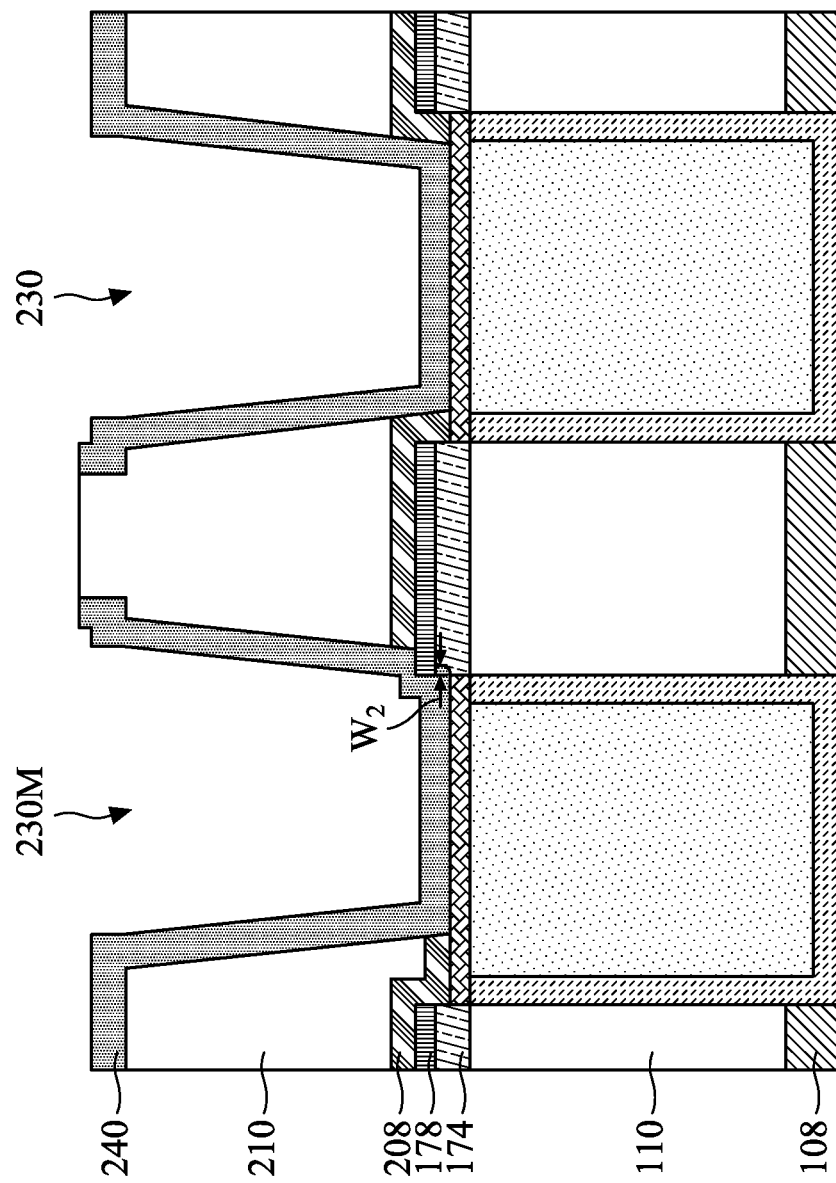

In FIGS. 11A through 11C, a liner layer 240 (e.g., including one or more barriers and one or more liners) is formed in the openings 230. The liner layer 240 may be formed of similar materials and by a similar process, such as conformally deposited, as described above in connection with the liner layer 140.

In FIGS. 11B and 11C, zoomed-in views of region 236 (see FIG. 11A) illustrate varying shapes of the lower portions of one of the openings 230, one of the misaligned openings 230M, and the liner layer 240. For example, the liner layer 240 may have a stair-step shape due to being formed over and around the second dielectric layer 178. Referring to FIG. 11C, a portion of the liner layer 240 may fill the second width $W_2$ adjacent to the first dielectric layer 174 and below the second dielectric layer 178. In some embodiments, the liner layer 240 does not completely fill the second width $W_2$, and a void (not specifically illustrated) may remain adjacent to the first dielectric layer 174 and below the second dielectric layer 178. The void may provide further insulation to the structure without inhibiting electrical flow through the first conductive features 120 and the second conductive features 220.

Figure 12A:
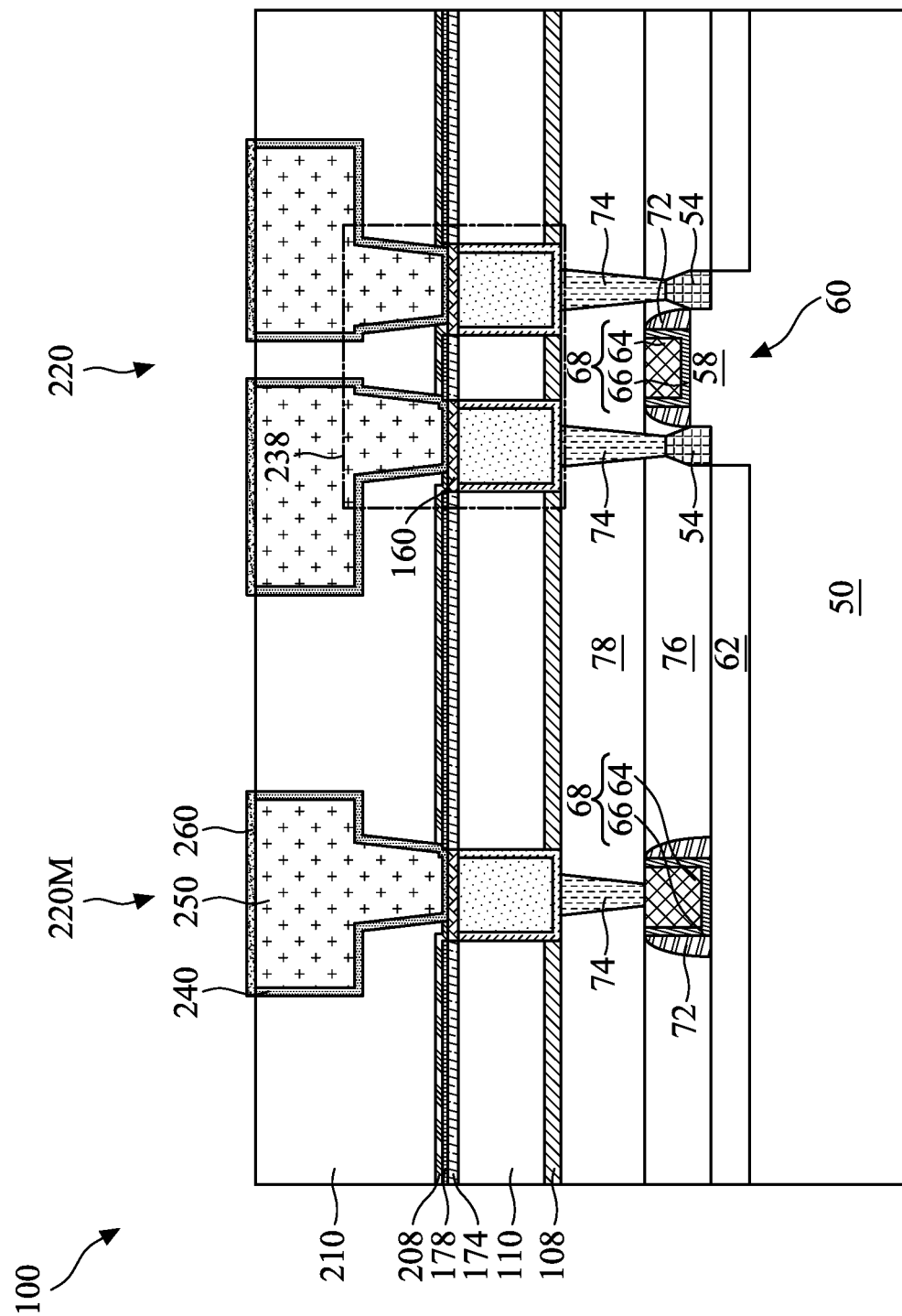
Figure 12B:
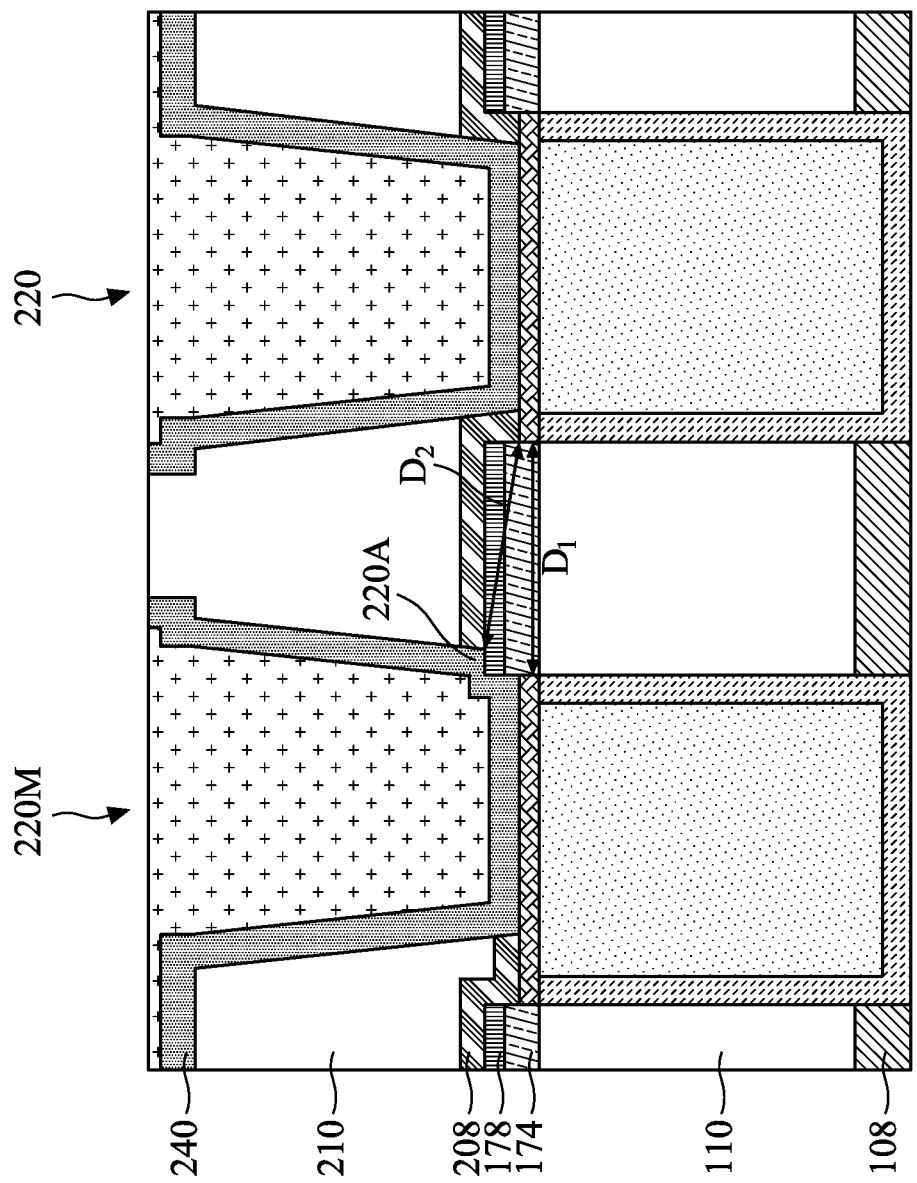
Figure 12C:
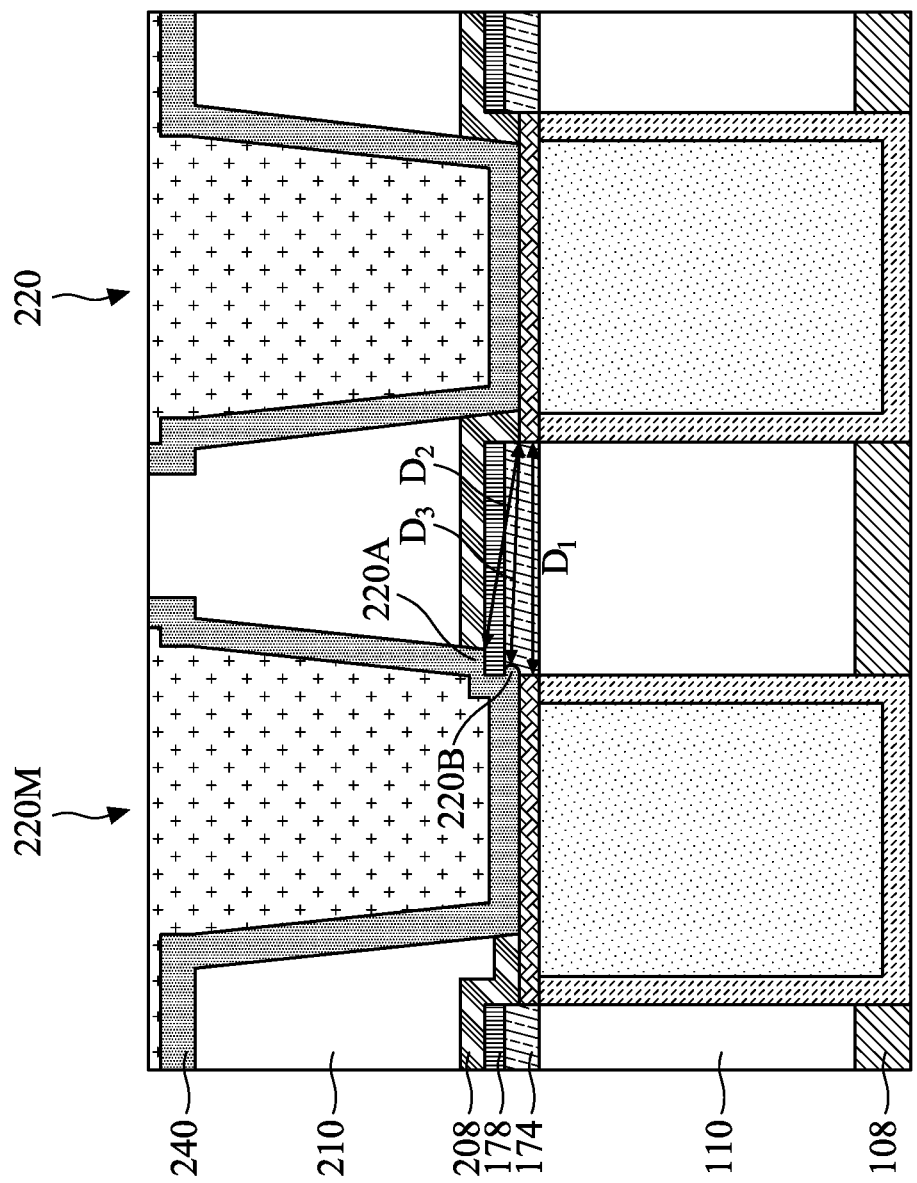

In FIGS. 12A through 12C, the second conductive features 220 are completed, for example, by filling the openings 230 with a conductive fill material 250, planarizing the conductive fill material 250 and the liner layer 240, and forming a capping layer 260 over the conductive fill material 250 and the liner layer 240. These processes may be formed using similar materials and by similar methods as described above in connection with the analogous features of the first conductive features 120. In embodiments in which the void described above remains after formation of the liner layer 240, the conductive fill material 250 may fill the void or the void may still remain.

In FIGS. 12B and 12C, zoomed-in views of region 238 (see FIG. 12A) illustrate varying shapes of one of the second conductive features 220 and one of the misaligned second conductive features 220M formed in the misaligned opening 230M. The misaligned second conductive feature 220M may comprise an overbite 220A and/or an underbite 220B. As discussed above, in accordance with some embodiments, the misaligned second conductive feature 220M may be located near one of the first conductive features 120 (as illustrated) without being directly electrically connected to one another. In spite of the overbite 220A and/or the underbite 220B causing the misaligned second conductive feature 220M to be closer to the first conductive feature 120, the benefits of the first dielectric layer 174 and the second dielectric layer 178 may be realized, as discussed below.

Referring to FIG. 12B, as discussed above, neighboring or adjacent ones of the first conductive features 120 may be separated from one another by the distance $D_1$. Without the presence of the first dielectric layer 174 and the second dielectric layer 178, the misaligned second conductive feature 220M would have an overbite that further extends down and to the side of the first conductive feature 120 to form a tiger-tooth shape. For example, without the first and second dielectric layers 174/178, the overbite portion of the misaligned second conductive feature 220M would extend further down along a sidewall of the first conductive feature 120 like the tooth of a saber-toothed tiger. As a result, the tiger-tooth would cause the misaligned second conductive feature 220M to be closer (than the distance $D_1$) to the nearby first conductive feature 120 (e.g., the nearby one of the first conductive features 120 that is not directly electrically connected to the misaligned second conductive feature 220M). Depending on how much closer, a parasitic capacitance could impede the performance of the completed integrated circuit device.

However, with the presence of the first dielectric layer 174 and the second dielectric layer 178, the overbite 220A described above and illustrated in the figures is formed (instead of the tiger-tooth) and remains a distance $D_2$ from the nearby first conductive feature 120. The second distance $D_2$ may be about the same or less than the first distance $D_1$. As a result, the overbite 220A of the misaligned second conductive feature 220M will have minimal to zero contribution to causing parasitic capacitance between the misaligned second conductive feature 220M and the nearby first conductive feature 120.

Referring to FIG. 12C, with the presence of the first dielectric layer 174 and the second dielectric layer 178, in addition to the overbite 220A above the first dielectric layer 174, the underbite 220B may extend below a portion of the second dielectric layer 178. The underbite 220B may be a third distance $D_3$ from the nearby first conductive feature 120 that is about the same or less than the first distance $D_1$ and/or the second distance $D_2$. As a result, the underbite 220B of the misaligned second conductive feature 220M will have minimal to zero contribution to causing parasitic capacitance between the misaligned second conductive feature 220M and the nearby first conductive feature 120. In some embodiments, the third distance $D_3$ is greater than the second distance $D_2$ due to both the second dielectric layer 178 and the capping layer 160 ensuring that only a small amount of etching occurs in the first dielectric layer 174.

Figure 13:
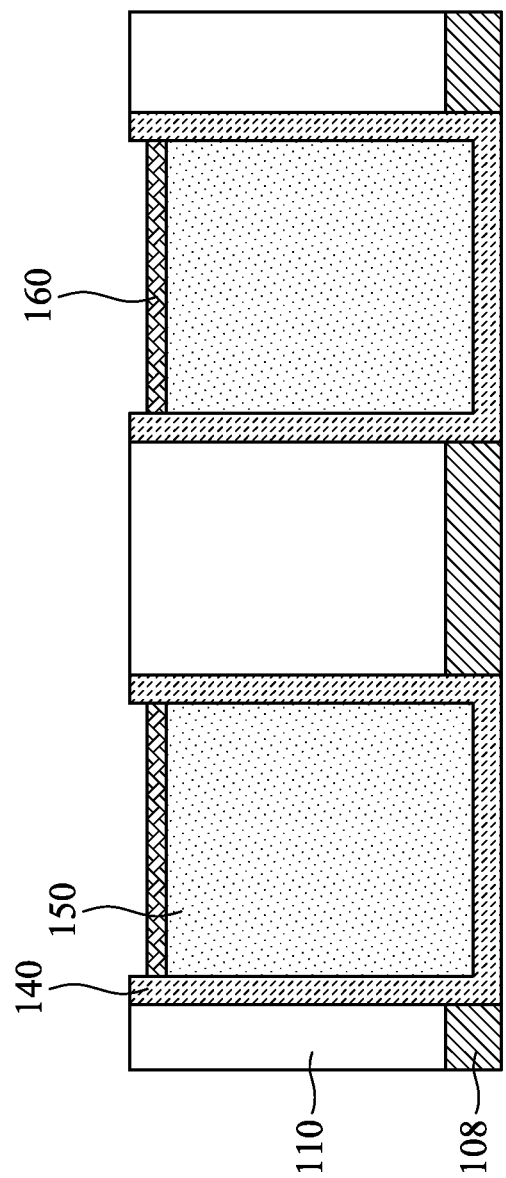
FIGS. 13, 14, 15, 16, and 17 illustrate cross-sectional views of intermediate stages in the formation of interconnect structures of integrated circuits, in accordance with some embodiments.

In FIGS. 13 through 17, in accordance with some embodiments, the front-side interconnect structure 80 is formed with a modification to the above described process. Referring to FIG. 13, before depositing the capping layer 160, upper portions of the first conductive features 120 (e.g., the conductive fill material 150) may be etched and recessed below a top surface of the liner layer 140 by between about 20 Å and about 50 Å. Next, the capping layer 160 may be selectively deposited over the structure and into the recesses by one of the methods listed above. In some embodiments, a top surface of the capping layer 160 remains below top surfaces of the liner layer 140 and the IMD layer 110.

Figure 14:
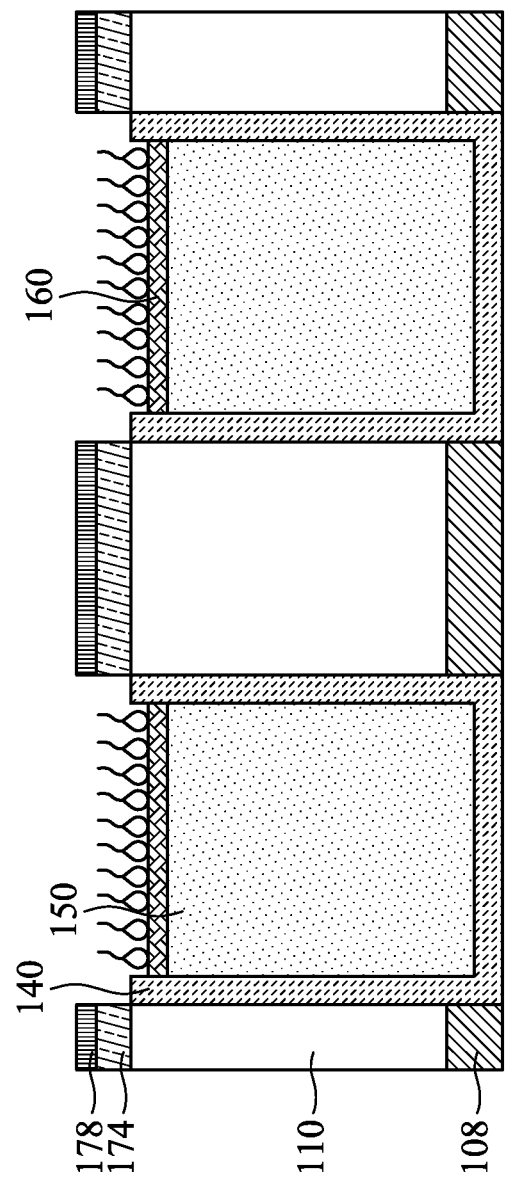

Referring to FIG. 14, the blocking film 170 is selectively deposited over the capping layer 160, the first dielectric layer 174 is selectively deposited over the IMD layer 110, and the second dielectric layer 178 is selectively deposited over the first dielectric layer 174, as described above. As illustrated, a top surface of the blocking film 170 may be above the top surfaces of the liner layer 140 and the IMD layer 110 while being below a top surface of the first dielectric layer 174. Although not specifically illustrated, in some embodiments, portions of the blocking film 170 will also form over the liner layer 140, thereby further preventing the first dielectric layer 174 and the second dielectric layer 178 from depositing directly on the liner layer 140.

Figure 15:
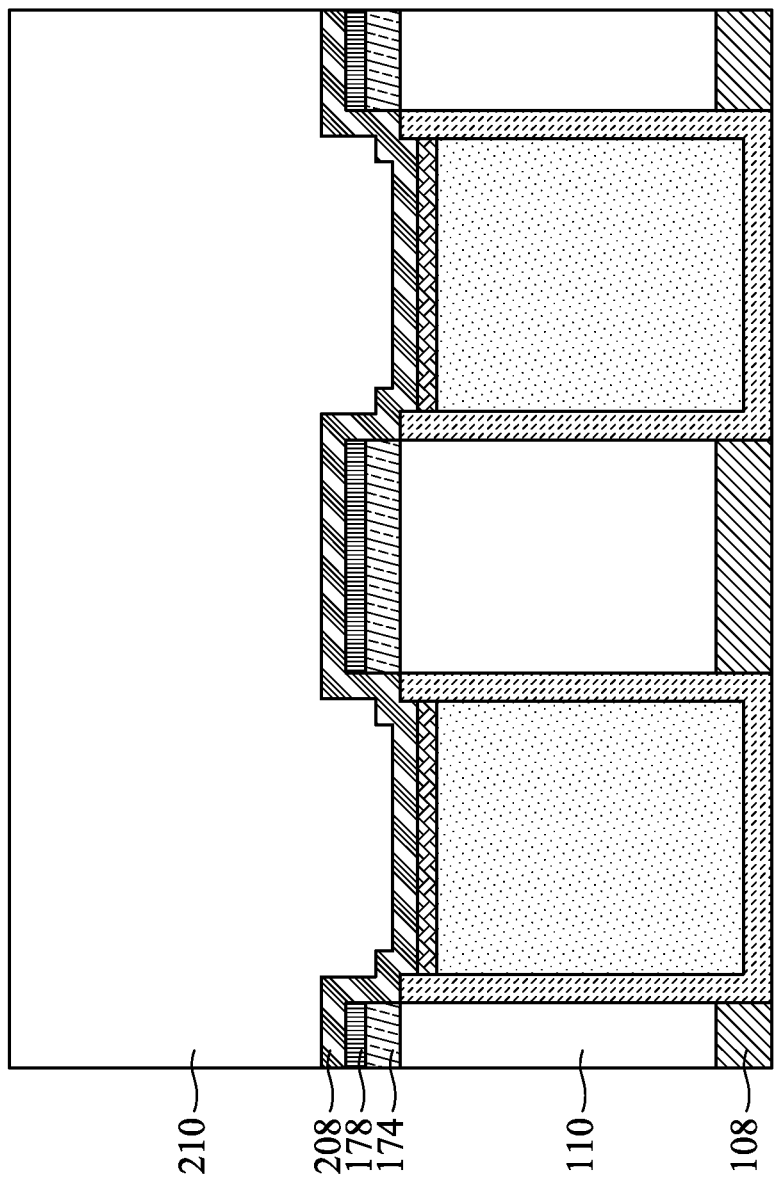
Figure 16:
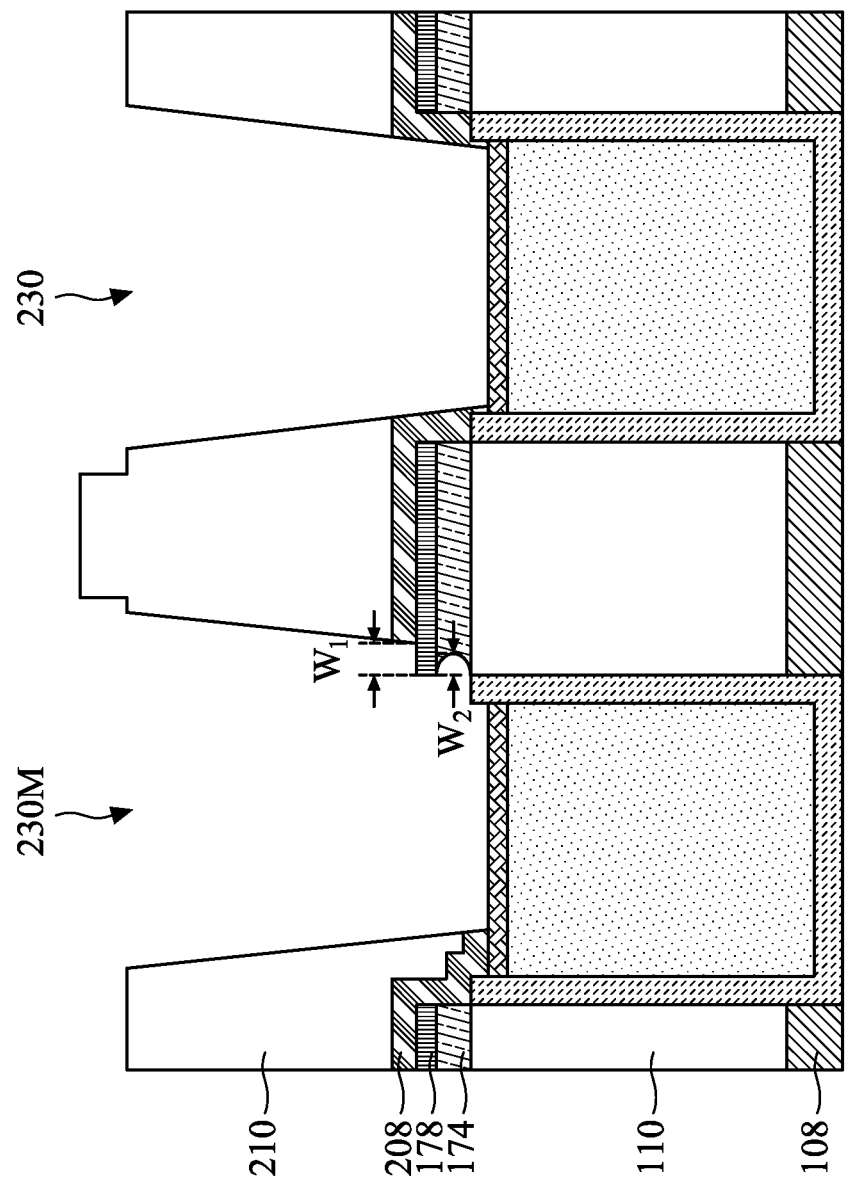
Figure 17:
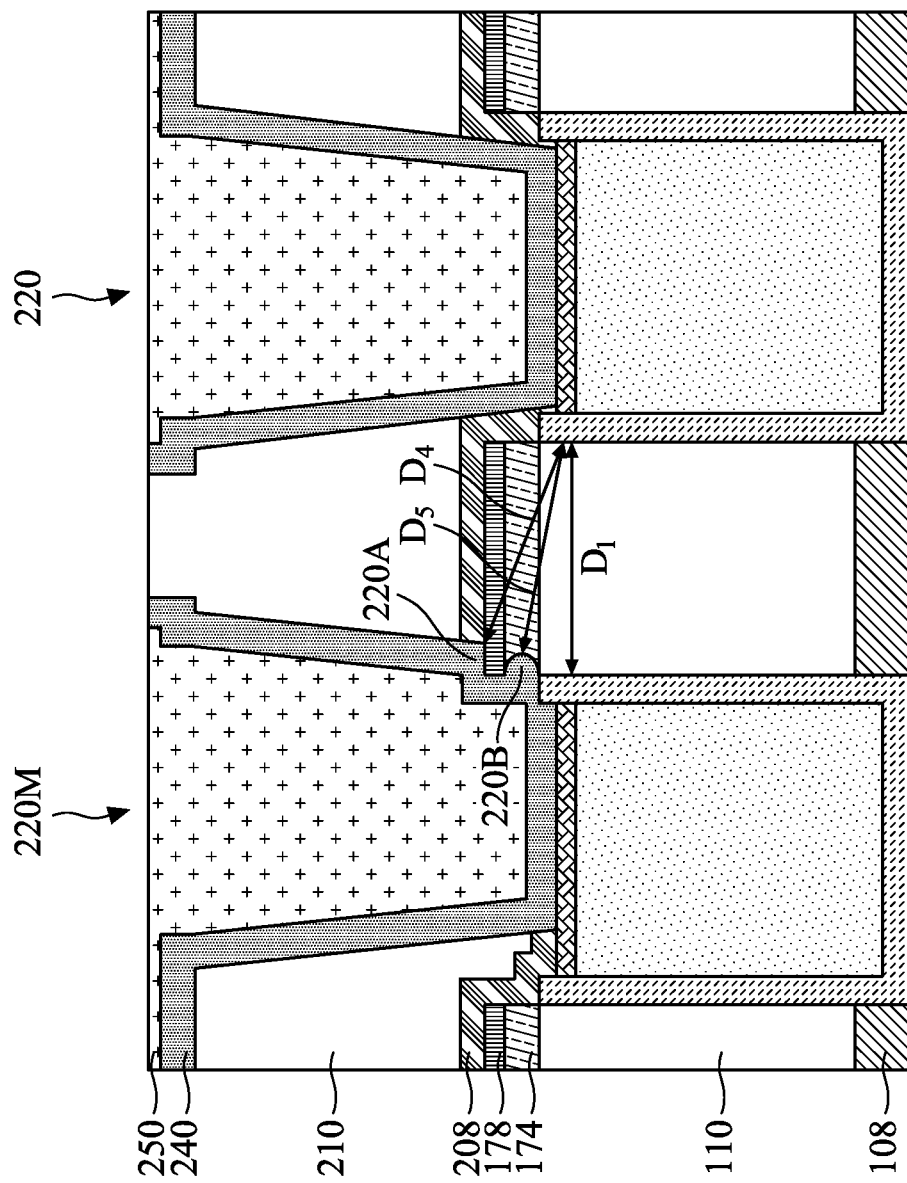

Referring to FIG. 15, the blocking film 170 is removed, the etch stop layer 208 is conformally deposited, and the IMD layer 210 is deposited, as described above. Referring to FIG. 16, the IMD layer 210 and the etch stop layer 208 are etched to form the openings 230 (including the misaligned openings 230M), which will house the second conductive features 220 (including the misaligned second conductive features 220M). As illustrated, the misaligned opening 230M may expose a first width $W_1$ of the second dielectric layer 178. In some embodiments not illustrated here, the second dielectric layer 178 may prevent the first dielectric layer 174 from being etched. However, in some embodiments illustrated here, a portion of the first dielectric layer 174 may be etched by a third width $W_3$ extending below the second dielectric layer 178. The third width $W_3$ may be less than first width $W_1$ due to protection from the overlying second dielectric layer 178, and greater than the second width $W_2$ due to the capping layer 160 not being adjacent and proximal enough to protect the first dielectric layer 174 from etching. For example, the third width $W_3$ may be between about 0 Å and about 50 Å.

Referring to FIG. 16, the liner layer 240 and the conductive fill material 250 are formed in the openings 230 and planarized to remove excess material as described above. As illustrated and described above, the resulting misaligned second conductive feature 220M formed in the misaligned opening 230M may comprise the overbite 220A and the underbite 220B. Although not specifically illustrated, in other embodiments, the underbite 220B is not formed because the first dielectric layer 174 may remain substantially unetched.

As discussed above, nearby ones of the first conductive features 120 may be separated from one another by the distance $D_1$. As such, the overbite 220A of the misaligned second conductive feature 220M may be a fourth distance $D_4$ from a nearby first conductive feature 120, and the fourth distance $D_4$ may be less than the first distance $D_1$ and greater than the second distance $D_2$ due to the conductive fill material 150 being recessed before forming the capping layer 160. Further, the underbite 220B of the misaligned second conductive feature 220M may be a fifth distance $D_5$ from the nearby first conductive feature 120, and the fifth distance $D_5$ may be less than the first distance $D_1$. In some embodiments, the fifth distance $D_5$ is less than the fourth distance $D_4$ due to the capping layer 160 not being proximal enough to reduce the etching that may occur in the first dielectric layer 174.

Embodiments achieve various advantages. The first dielectric layer 174 and the second dielectric layer 178 ensure that upper level conductive features (e.g., the second conductive features 220) maintain enough distance from lower level conductive features (e.g., the first conductive features 120) to prevent or reduce parasitic capacitance when the upper level conductive features are misaligned (e.g., the misaligned second conductive features 220M). As noted above, the low-k material used in the first dielectric layer 174 ensures that parasitic capacitance is prevented or reduced between all conductive features, whether first conductive features 120 or second conductive features 220/220M and whether correctly aligned or misaligned. The blocking film 170 ensures that the first dielectric layer 174 and the second dielectric layer 178 are selectively formed over the IMD layers 110/210. As a result, during any misalignment of the upper conductive features, the second dielectric layer 178 prevents or minimizes etching of the first dielectric layer 174, which thereby prevents etching of the underlying IMD layer 110. Further, in the cases of misalignments in the second conductive features 220M, the low-k material of the first dielectric layer 174 minimizes any parasitic capacitance that would otherwise occur.

In an embodiment, a method includes forming a first conductive feature in a first inter-metal dielectric (IMD) layer; depositing a blocking film over and physically contacting the first conductive feature; depositing a first dielectric layer over and physically contacting the first IMD layer; depositing a second dielectric layer over and physically contacting the first dielectric layer; removing the blocking film; depositing an etch stop layer over any physically contacting the first conductive feature and the second dielectric layer; forming a second IMD layer over the etch stop layer; etching an opening in the second IMD layer and the etch stop layer to expose the first conductive feature; and forming a second conductive feature in the opening. In another embodiment, the first dielectric layer is a low-k dielectric material, and wherein the second dielectric layer is a high-k dielectric material. In another embodiment, the etch stop layer and the second dielectric layer comprise different etch selectivities. In another embodiment, depositing the blocking film comprises selectively depositing the blocking film over the first conductive feature. In another embodiment, removing the blocking film comprises selectively removing the blocking film. In another embodiment, etching the opening further exposes a portion of the second dielectric layer. In another embodiment, during the etching the opening, an entirety of the first IMD layer directly below the portion of the second dielectric layer remains unetched. In another embodiment, during the etching the opening, the first dielectric layer is etched by a greater amount than the second dielectric layer.

In an embodiment, a method includes forming a first conductive feature and a second conductive feature in a first dielectric layer; forming a blocking layer over the first conductive feature and the second conductive feature; forming a multilayer dielectric over the first dielectric layer and laterally displaced from the blocking layer, the multilayer dielectric comprising a low-k dielectric layer disposed over the first dielectric layer and a high-k dielectric layer disposed over the low-k dielectric layer; flowing a reacting gas to remove the blocking layer; depositing an etch stop layer over the high-k dielectric layer; depositing a second dielectric layer over the etch stop layer; forming a trench in the second dielectric layer and the etch stop layer, the forming the trench comprising exposing the first conductive feature and the high-k dielectric layer; and forming a third conductive feature in the trench. In another embodiment, the forming the trench comprises etching portions of the second dielectric layer, the etch stop layer, and the low-k dielectric layer. In another embodiment, the etch stop layer and the high-k dielectric layer have a high etch selectivity. In another embodiment, the third conductive feature comprises a bulk portion extending to a top surface of the first conductive feature and an overbite portion extending to a top surface of the high-k dielectric layer. In another embodiment, the first conductive feature is a first distance from the second conductive feature, wherein the third conductive feature is a second distance from the second conductive feature, and wherein the second distance is less than the first distance. In another embodiment, the reacting gas comprises $H_2$ and/or $NH_3$. In another embodiment, the low-k dielectric layer comprises silicon oxide, and wherein the high-k dielectric layer comprises aluminum oxide.

In an embodiment, a device includes a first conductive feature and a second conductive feature embedded in a first insulating layer, the first conductive feature being a first distance from the second conductive feature; a low-k dielectric layer disposed over the first insulating layer; a high-k dielectric layer disposed over the low-k dielectric layer; a second insulating layer disposed over the high-k dielectric layer; and a third conductive feature embedded in the second insulating layer and physically contacting the first conductive feature, the high-k dielectric layer being directly interposed between a first portion and a second portion of the third conductive feature, the first portion of the third conductive feature being a second distance from the second conductive feature, the second distance being less than the first distance. In another embodiment, the second portion of the third conductive feature is a third distance from the second conductive feature, the third distance being less than the first distance. In another embodiment, the second portion is interposed between the first insulating layer and the high-k dielectric layer. In another embodiment, the third conductive feature further physically contacts sidewalls of the low-k dielectric layer, the high-k dielectric layer, and the second insulating layer. In another embodiment, the third conductive feature further physically contacts a top surface of the high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first conductive feature and a second conductive feature embedded in a first insulating layer, the first conductive feature being a first distance from the second conductive feature;
   a low-k dielectric layer disposed over the first insulating layer;
   a high-k dielectric layer disposed over the low-k dielectric layer;
   a second insulating layer disposed over the high-k dielectric layer; and
   a third conductive feature embedded in the second insulating layer and physically contacting the first conductive feature, the high-k dielectric layer being directly interposed between a first portion and a second portion of the third conductive feature, the first portion of the third conductive feature being a second distance from the second conductive feature, the second distance being less than the first distance.

2. The device of claim 1, wherein the second portion of the third conductive feature is a third distance from the second conductive feature, the third distance being less than the first distance.

3. The device of claim 2, wherein the second portion is interposed between the first insulating layer and the high-k dielectric layer.

4. The device of claim 1, wherein the third conductive feature further physically contacts sidewalls of the low-k dielectric layer, the high-k dielectric layer, and the second insulating layer.

5. The device of claim 4, wherein the third conductive feature further physically contacts a top surface of the high-k dielectric layer.

6. The device of claim 1, wherein the high-k dielectric layer being directly interposed between the first portion and the second portion of the third conductive feature comprises:
   the first portion being in physical contact with an upper surface of the high-k dielectric layer; and
   the second portion being in physical contact with a lower surface of the high-k dielectric layer, the lower surface being opposite to the upper surface.

7. The device of claim 1, wherein the first conductive feature comprises a cobalt capping layer, and wherein a sidewall of the cobalt capping layer is in physical contact with a sidewall of the low-k dielectric layer.

8. The device of claim 1, wherein the low-k dielectric layer comprises a first segment extending between the third conductive feature and the second conductive feature, wherein the high-k dielectric layer comprises a second segment extending between the third conductive feature and the second conductive feature, and wherein the first segment is shorter than the second segment.

9. A device comprising:
a first conductive feature embedded in a first inter-metal dielectric (IMD) layer;
a low-k dielectric layer disposed over the first IMD layer;
a high-k dielectric layer disposed over the low-k dielectric layer;
an etch stop layer disposed over and physically contacting the first conductive feature and the high-k dielectric layer;
a second IMD layer disposed over the etch stop layer; and
a second conductive feature embedded in the second IMD layer and physically contacting the first conductive feature, the high-k dielectric layer, the etch stop layer, and the second IMD layer, the second conductive feature comprising an underbite portion interposed between the high-k dielectric layer and the first IMD layer.

10. The device of claim 9, wherein the second conductive feature further physically contacts the low-k dielectric layer.

11. The device of claim 9, wherein the second conductive feature comprises an overbite portion directly above the high-k dielectric layer and the first IMD layer.

12. The device of claim 9 further comprising a third conductive feature embedded in the first IMD layer and laterally displaced from the first conductive feature.

13. The device of claim 12, wherein the third conductive feature is closer to the second conductive feature than to the first conductive feature.

14. The device of claim 9, wherein the first conductive feature comprises a cobalt capping layer, and wherein a sidewall of the cobalt capping layer physically contacts a sidewall of the low-k dielectric layer.

15. A device comprising:
a first extra-low-k dielectric layer over a substrate;
a first conductive feature and a second conductive feature embedded in the first extra-low-k dielectric layer, the first extra-low-k dielectric layer comprising a first segment extending from the first conductive feature to the second conductive feature;
a low-k dielectric layer over the first extra-low-k dielectric layer, the low-k dielectric layer comprising a second segment extending along a top surface of the first segment and between the first conductive feature and the second conductive feature;
a high-k dielectric layer over the low-k dielectric layer, the high-k dielectric layer comprising a third segment extending along a top surface of the second segment and between the first conductive feature and the second conductive feature;
an etch stop layer over the high-k dielectric layer, the etch stop layer comprising a fourth segment extending along a top surface of the third segment, a sidewall of the third segment, and a sidewall of the second segment;
a second extra-low-k dielectric layer over the high-k dielectric layer; and
a third conductive feature embedded in the second extra-low-k dielectric layer and in physical contact with the first conductive feature.

16. The device of claim 15, wherein the fourth segment of the etch stop layer is in physical contact with the third conductive feature and the second conductive feature.

17. The device of claim 15, wherein the third segment is longer than the second segment.

18. The device of claim 15, wherein the third conductive feature comprises a first portion in physical contact with the second segment and the third segment, and wherein the first portion is directly interposed between the second segment and the third segment.

19. The device of claim 18, wherein the first portion of the third conductive feature is closer to the second conductive feature than the first conductive feature is to the second conductive feature.

20. The device of claim 9, wherein in a cross-section a first segment of the low-k dielectric layer extends along the first IMD layer between the first conductive feature and the second conductive feature, wherein in the cross-section a second segment of the high-k dielectric layer extends along the first segment, wherein an upper surface of the first segment is in contact with a lower surface of the second segment, and wherein the lower surface of the second segment is longer than the upper surface of the first segment.

* * * * *